United States Patent
Dan

(10) Patent No.: US 11,013,128 B2
(45) Date of Patent: May 18, 2021

(54) METHOD FOR MANUFACTURING FLEXIBLE PRINTED CIRCUIT BOARD AND FLEXIBLE PRINTED CIRCUIT BOARD MANUFACTURED BY SAME

(71) Applicant: AMOSENSE CO., LTD, Cheonan-si (KR)

(72) Inventor: Sung-Baek Dan, Hwaseong-si (KR)

(73) Assignee: AMOSENSE CO., LTD, Chungcheongnam-Do (KR)

( * ) Notice: Subject to any disclaimer, the term of this patent is extended or adjusted under 35 U.S.C. 154(b) by 126 days.

(21) Appl. No.: 16/328,639

(22) PCT Filed: Aug. 29, 2017

(86) PCT No.: PCT/KR2017/009451
§ 371 (c)(1),
(2) Date: Feb. 26, 2019

(87) PCT Pub. No.: WO2018/044053
PCT Pub. Date: Mar. 8, 2018

(65) Prior Publication Data
US 2020/0337158 A1    Oct. 22, 2020

(30) Foreign Application Priority Data

Aug. 31, 2016  (KR) .................. 10-2016-0112070
Aug. 31, 2016  (KR) .................. 10-2016-0112071
(Continued)

(51) Int. Cl.
*H05K 1/02*    (2006.01)
*H05K 3/46*    (2006.01)
(Continued)

(52) U.S. Cl.
CPC ......... *H05K 3/4644* (2013.01); *H05K 1/0201* (2013.01); *H05K 1/0277* (2013.01);
(Continued)

(58) Field of Classification Search
CPC .......... H05K 1/0277–0283; H05K 3/46–4697
See application file for complete search history.

(56) References Cited

U.S. PATENT DOCUMENTS 5,719,354 A   2/1998  Jester et al.
8,283,570 B2  10/2012 Tomura et al.

FOREIGN PATENT DOCUMENTS

CN    101610634 A    12/2009
CN    101869008 A    10/2010
(Continued)

OTHER PUBLICATIONS

Office Action issued in Japanese Application No. 2019-511862, dated Feb. 25, 2020.

*Primary Examiner* — Jeremy C Norris
(74) *Attorney, Agent, or Firm* — CL Intellectual LLC

(57) ABSTRACT

Disclosed is a method for manufacturing a flexible printed circuit board and a flexible printed circuit board manufactured thereby, which minimizes a dielectric loss due to a high frequency signal and preventing a loss of the high frequency signal. The disclosed method for manufacturing the flexible printed circuit board according to an embodiment of the present disclosure includes preparing a base sheet; preparing a bonding sheet having a melting temperature lower than a melting temperature of the base sheet; forming a laminate by stacking the base sheet and the bonding sheet; and bonding by heating and pressurizing the laminate.

16 Claims, 21 Drawing Sheets

(30) Foreign Application Priority Data

Aug. 31, 2016 (KR) ........................ 10-2016-0112072
Aug. 31, 2016 (KR) ........................ 10-2016-0112073
Aug. 31, 2016 (KR) ........................ 10-2016-0112074

(51) Int. Cl.
 *H05K 1/03* (2006.01)
 *H05K 3/00* (2006.01)
 *H05K 3/06* (2006.01)
 *H05K 3/42* (2006.01)

(52) U.S. Cl.
 CPC ........... *H05K 1/036* (2013.01); *H05K 3/0011* (2013.01); *H05K 3/06* (2013.01); *H05K 3/422* (2013.01); *H05K 3/423* (2013.01); *H05K 2201/0141* (2013.01); *H05K 2201/0154* (2013.01); *H05K 2201/0158* (2013.01)

(56) References Cited

FOREIGN PATENT DOCUMENTS

| | | |
|---|---|---|
| JP | 8-97565 A | 4/1996 |
| JP | 10-303561 A | 11/1998 |
| JP | 11-261242 A | 9/1999 |
| JP | 2003-174260 A | 6/2003 |
| JP | 2004-214410 A | 7/2004 |
| JP | 2005072187 A | 3/2005 |
| KR | 10-0662643 B1 | 12/2006 |
| KR | 2008-0053911 A | 6/2008 |
| KR | 2015-0047760 A | 5/2015 |
| KR | 2015-0062059 A | 6/2015 |
| KR | 2016-0097948 A | 8/2016 |
| WO | 00/57469 A1 | 9/2000 |
| WO | 2009081518 A1 | 7/2009 |
| WO | 2014192494 A1 | 12/2014 |

[FIG. 1]
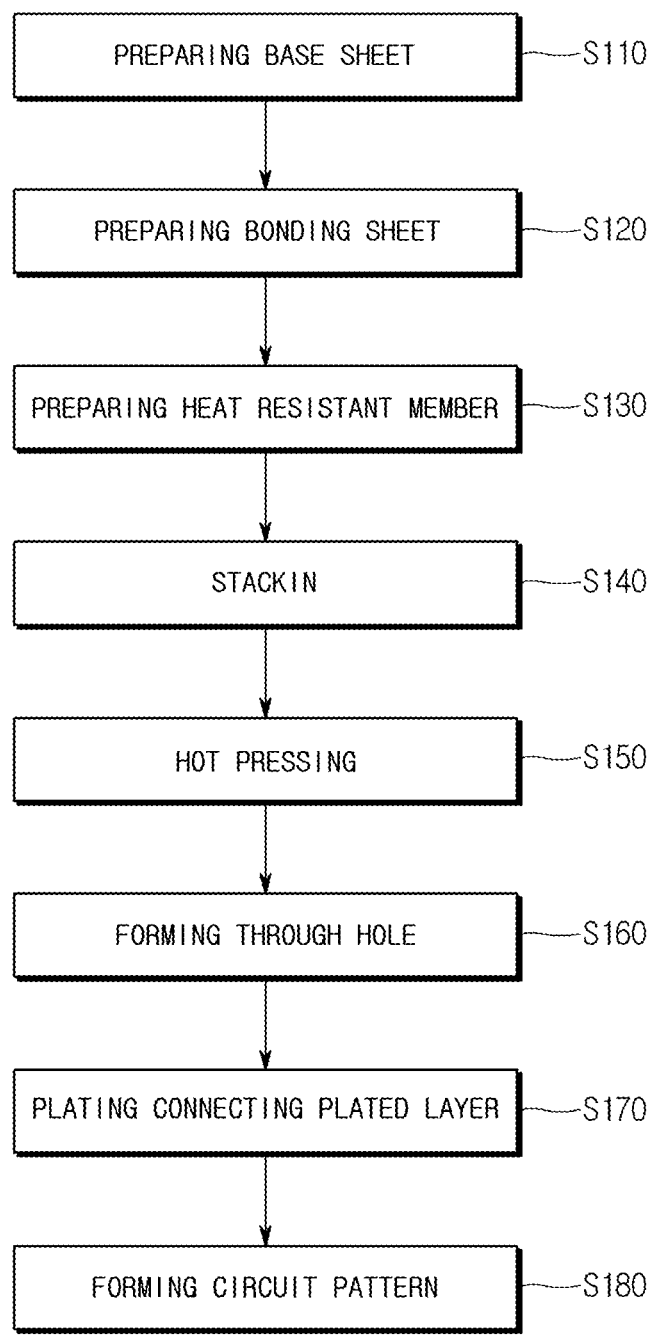

[FIG. 2]
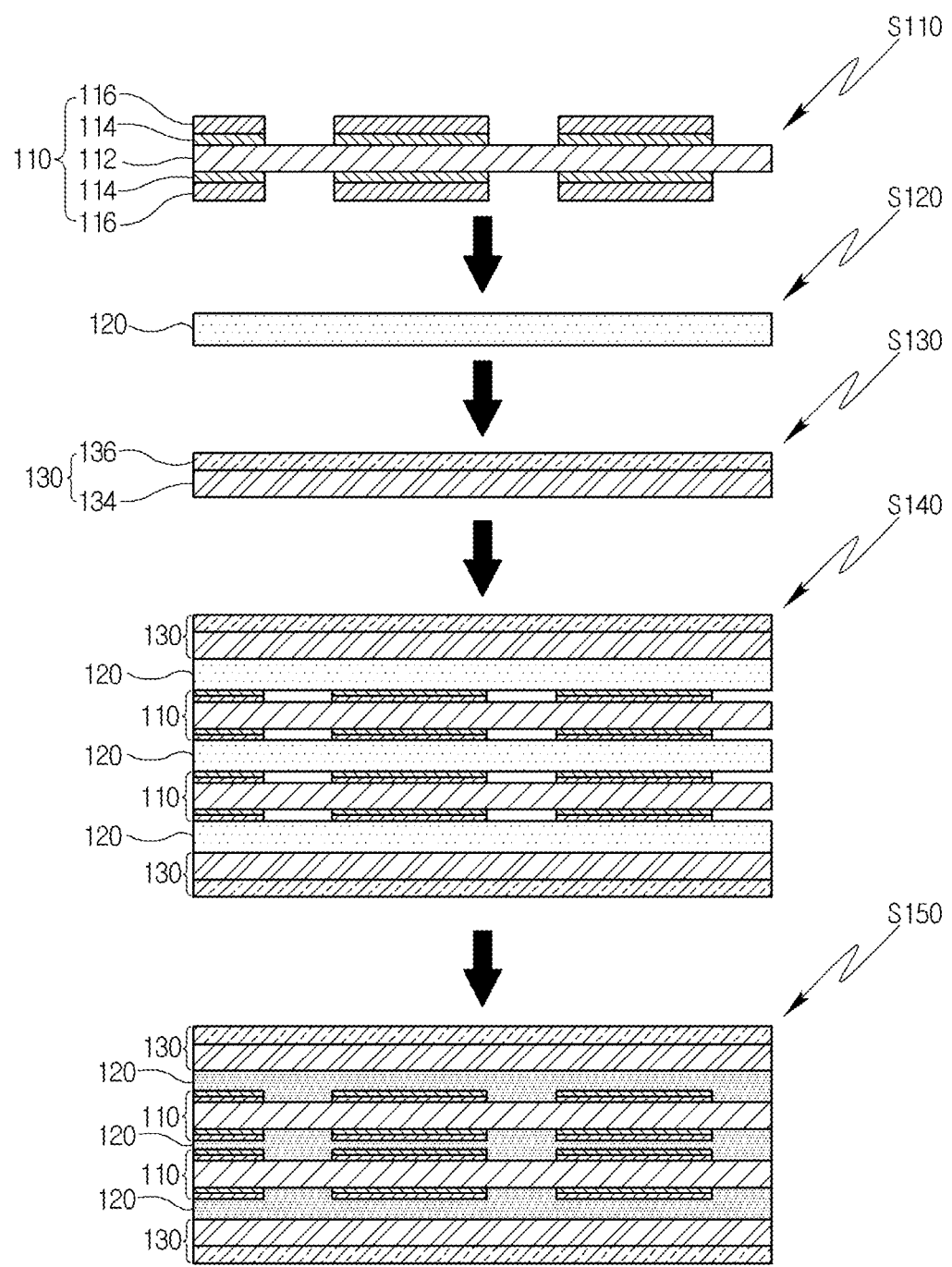

[FIG. 3]
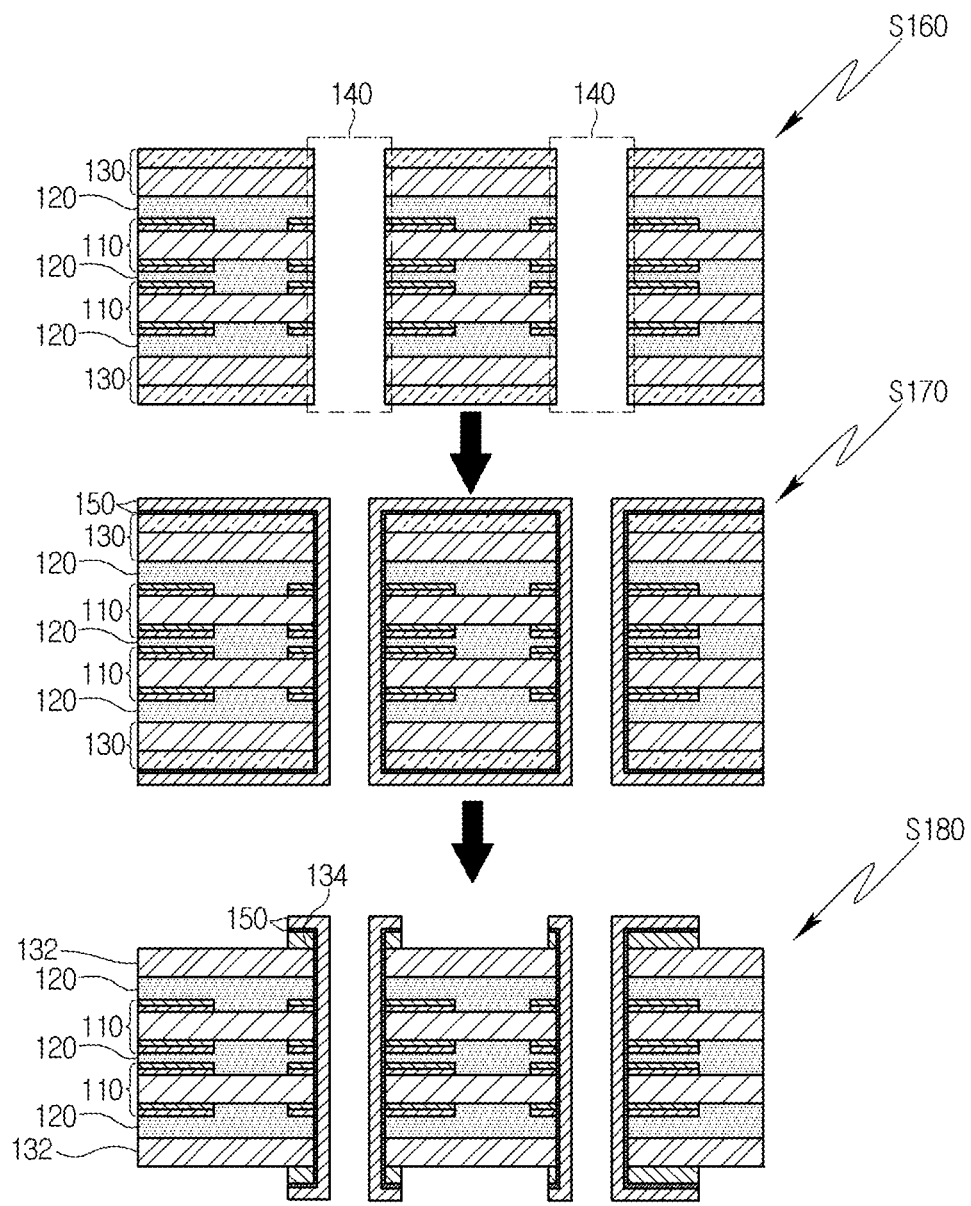

[FIG. 4]
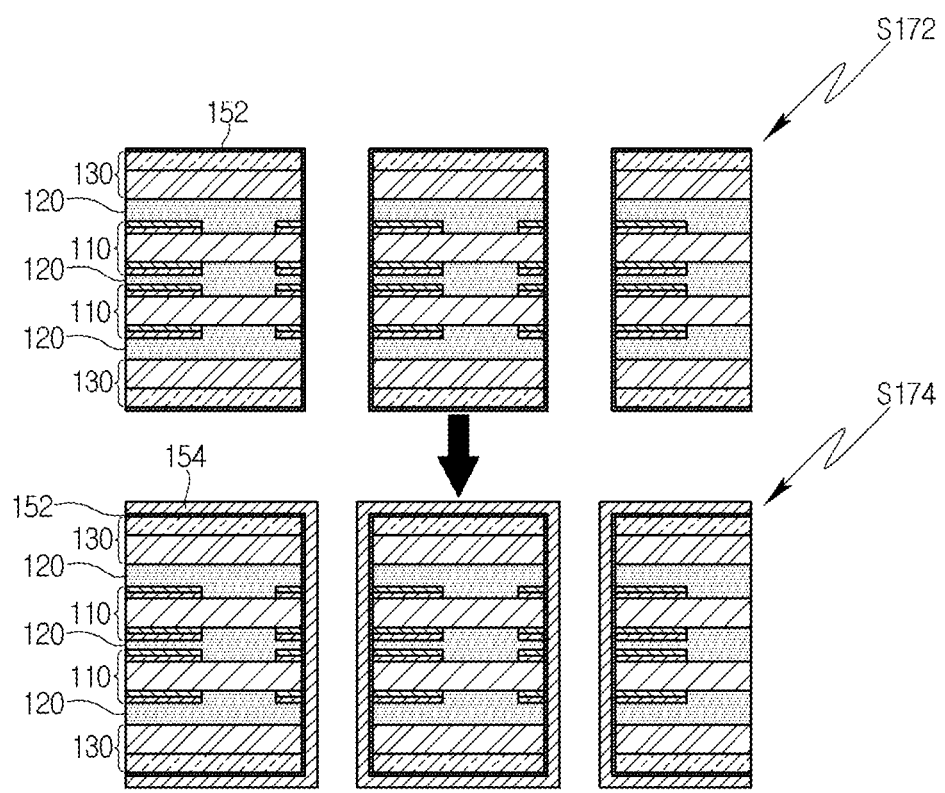
[FIG. 5]
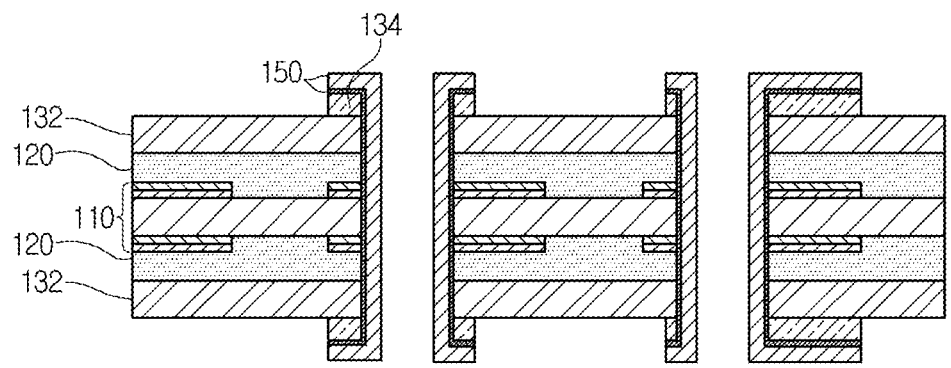

[FIG. 6]
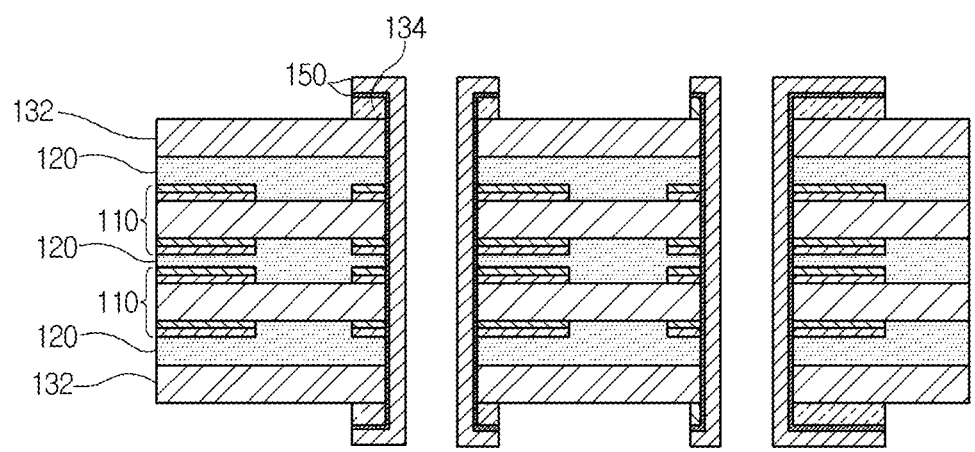

[FIG. 7]
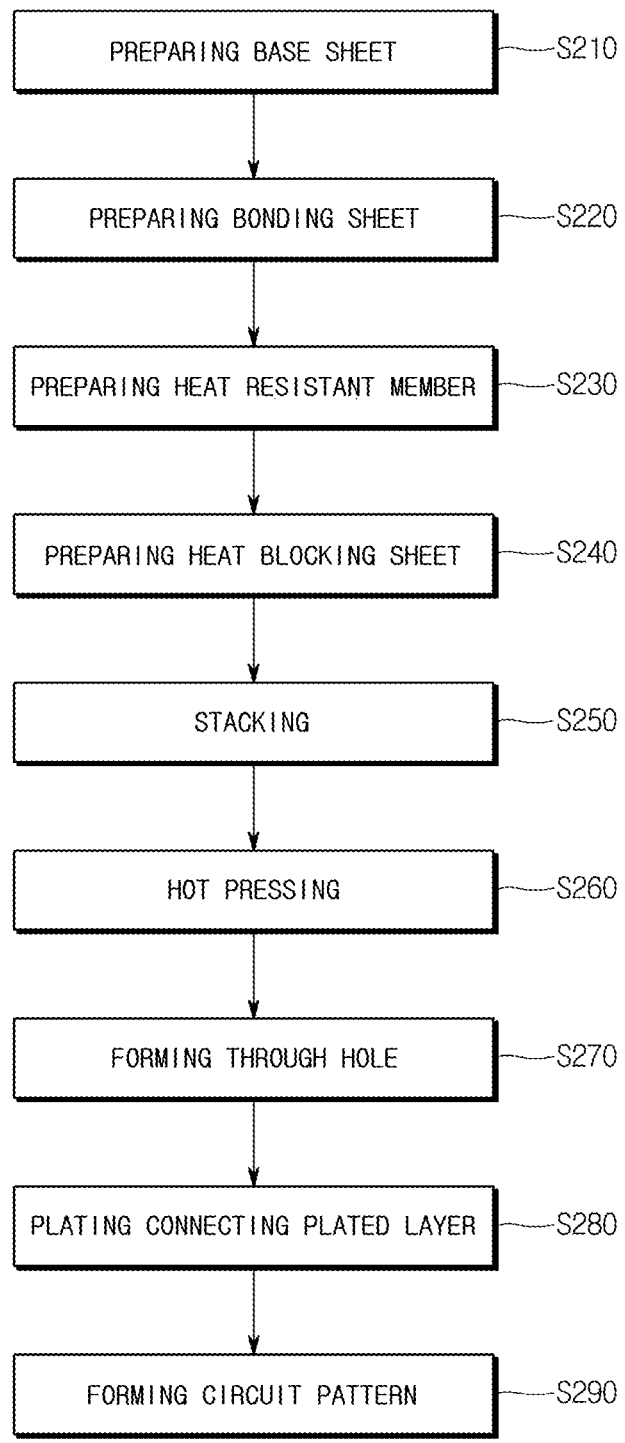

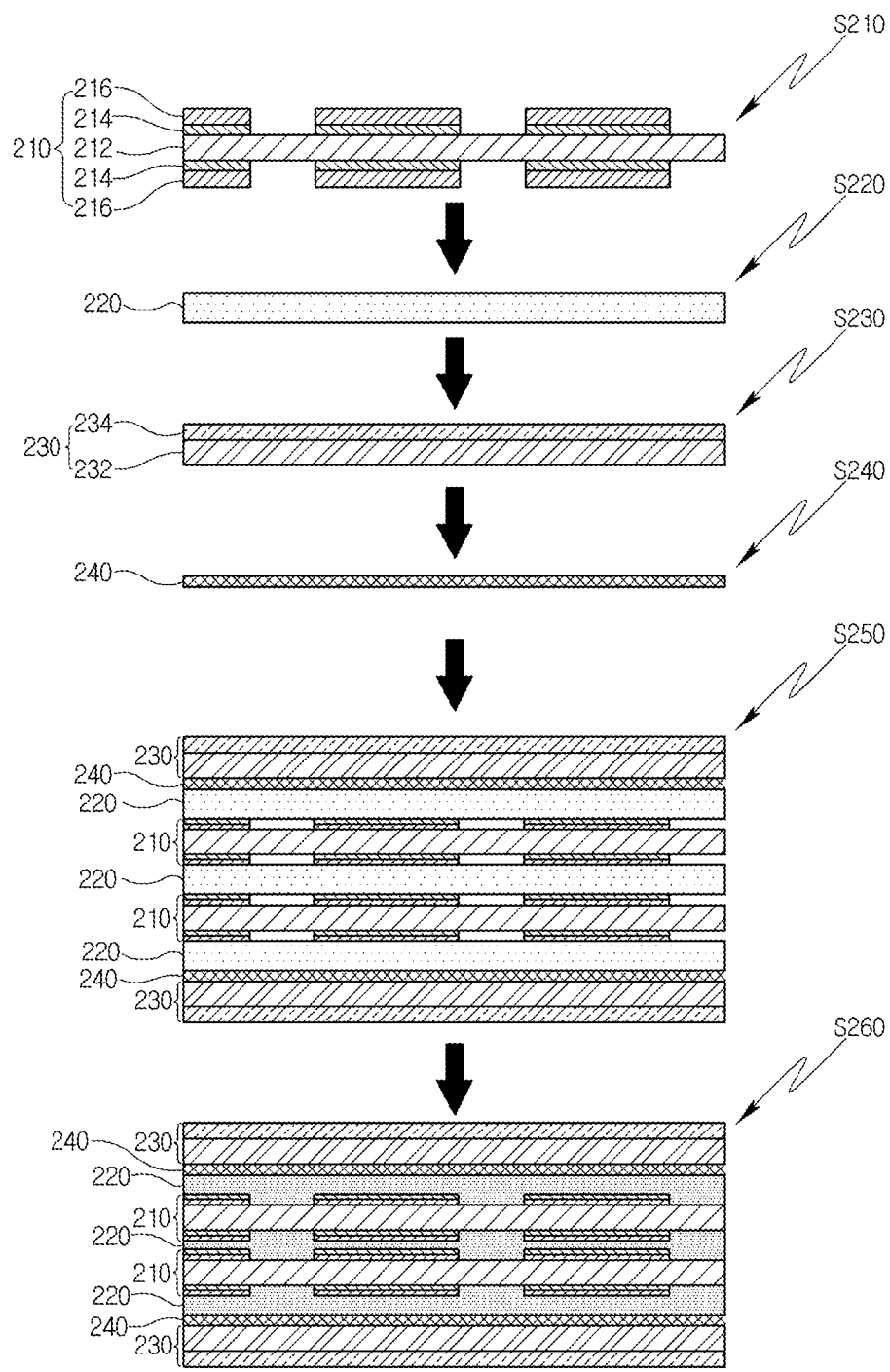
[FIG. 8]

[FIG. 9]
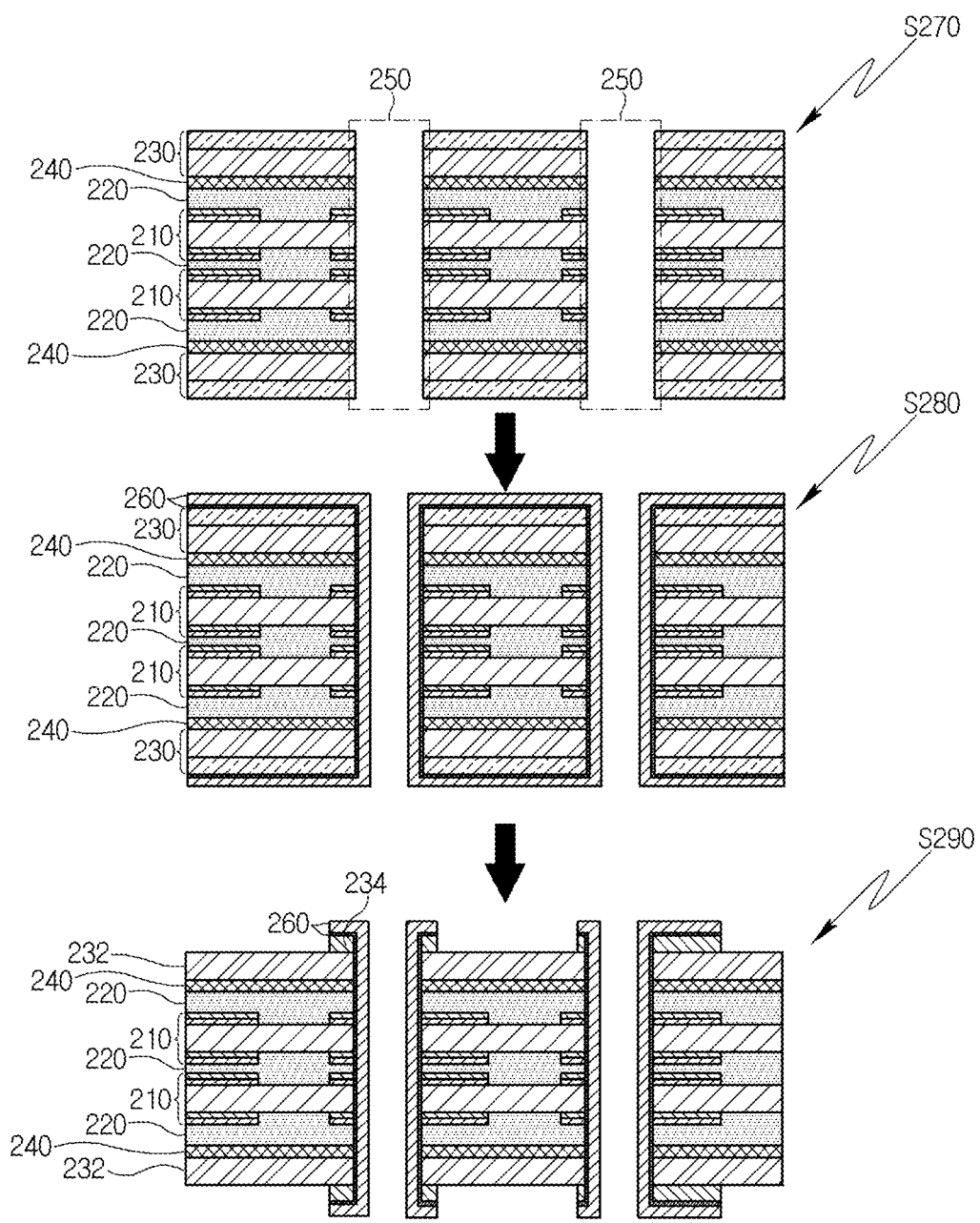

[FIG. 10]
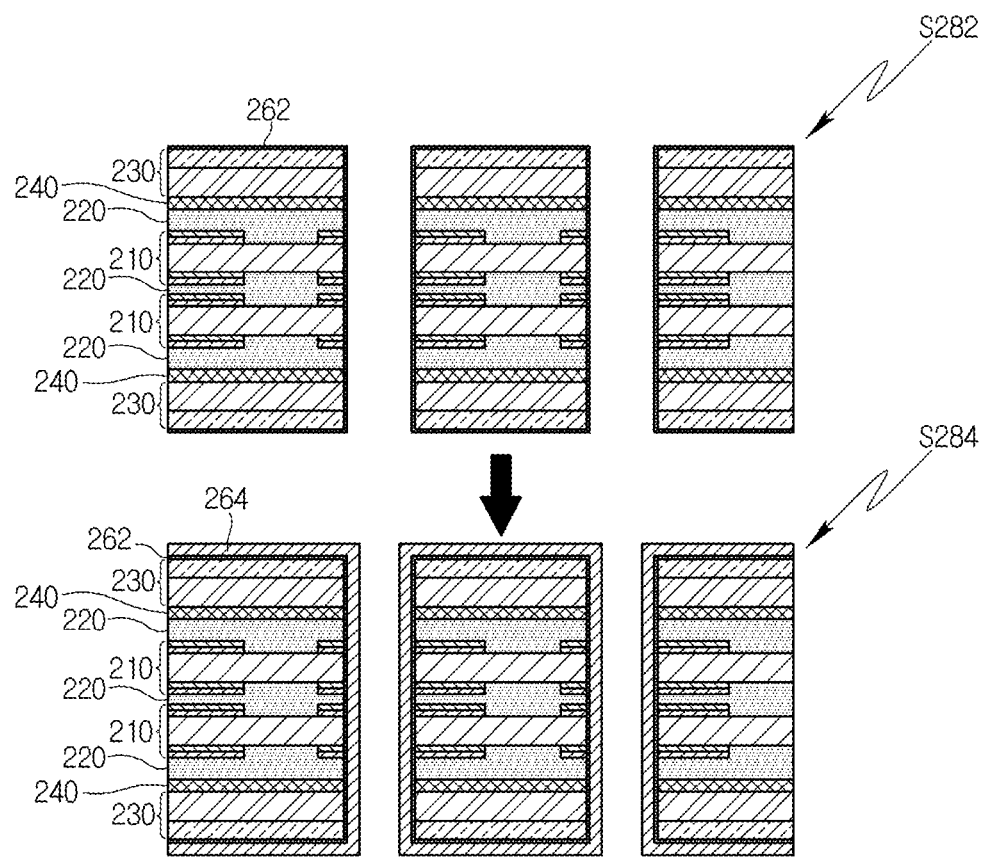
[FIG. 11]
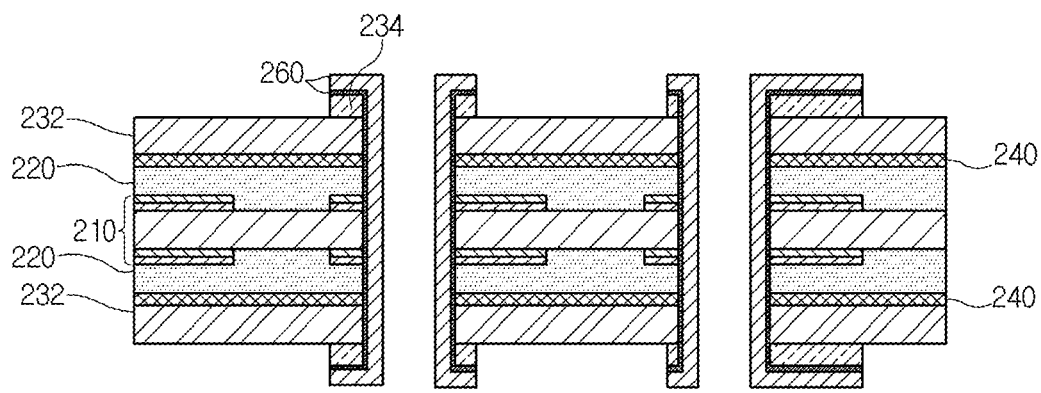

[FIG. 12]
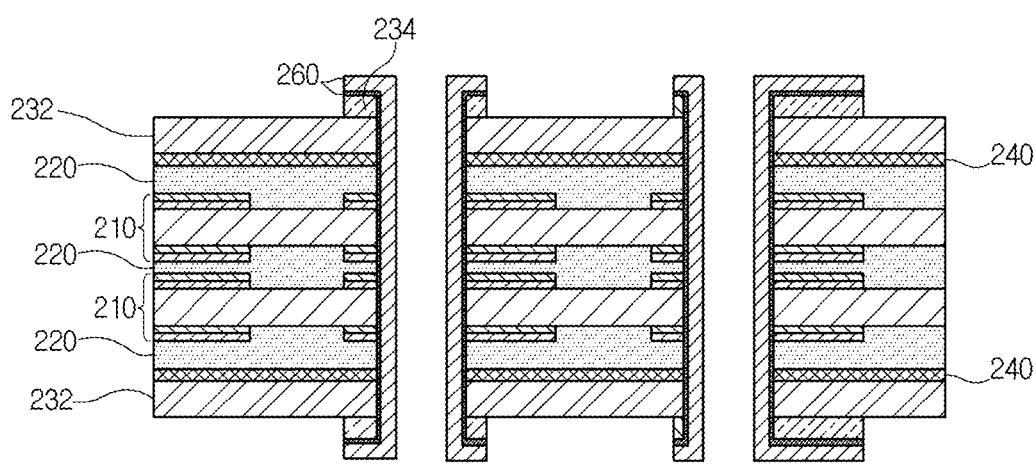

[FIG. 13]
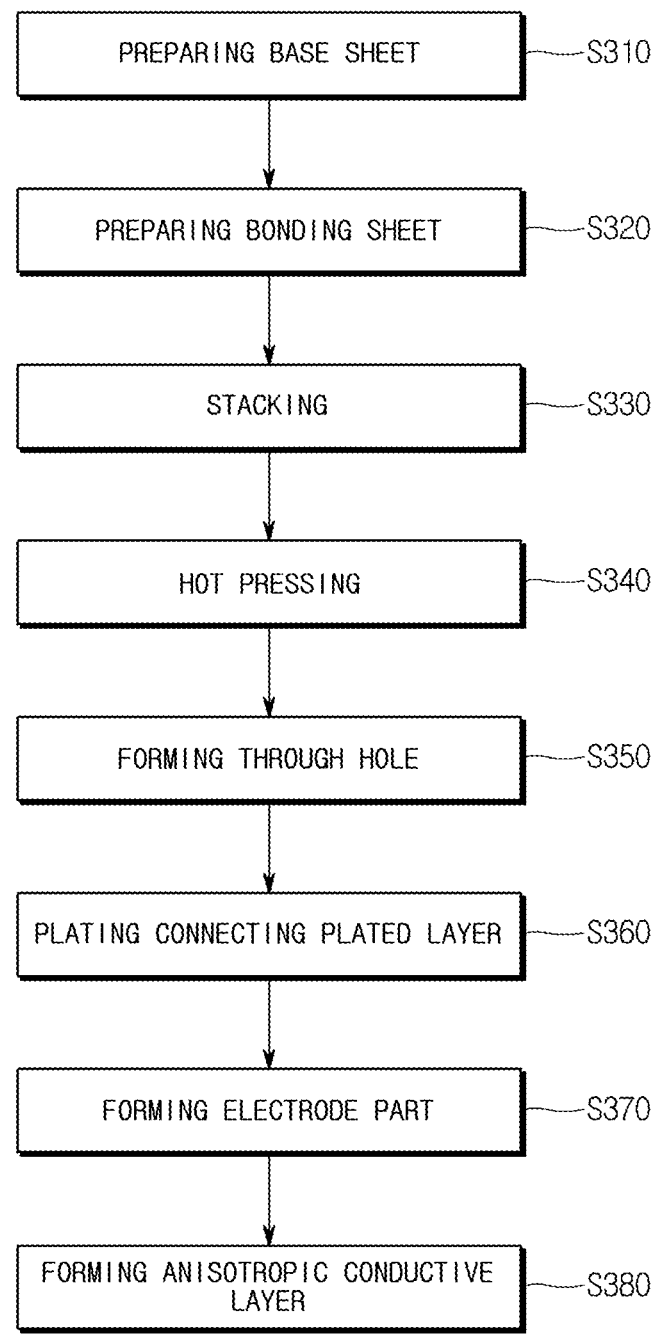

[FIG. 14]
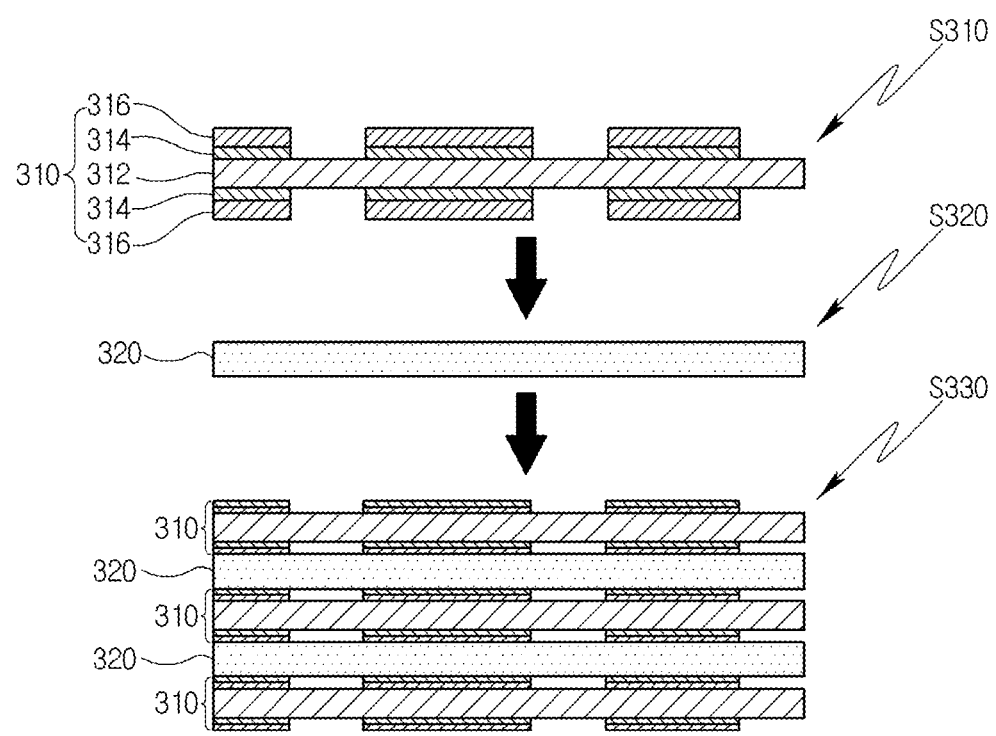

[FIG. 15]
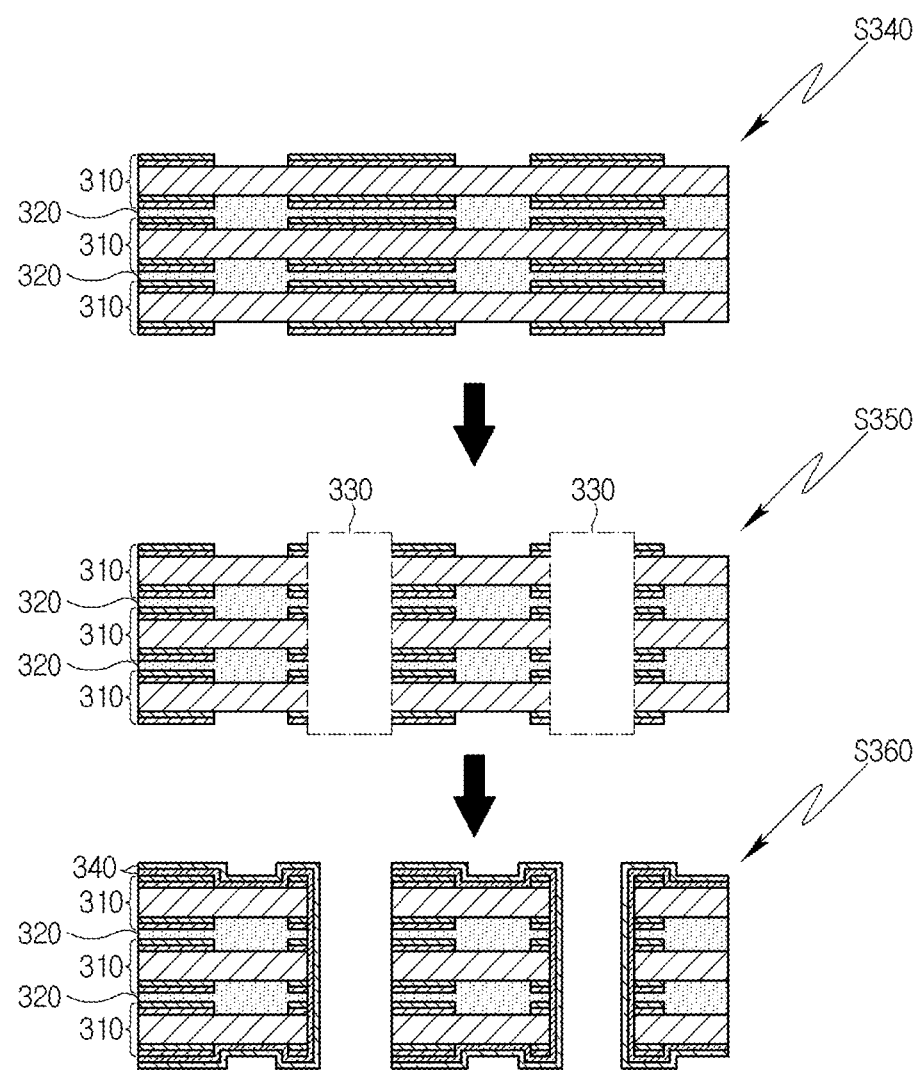

[FIG. 16]
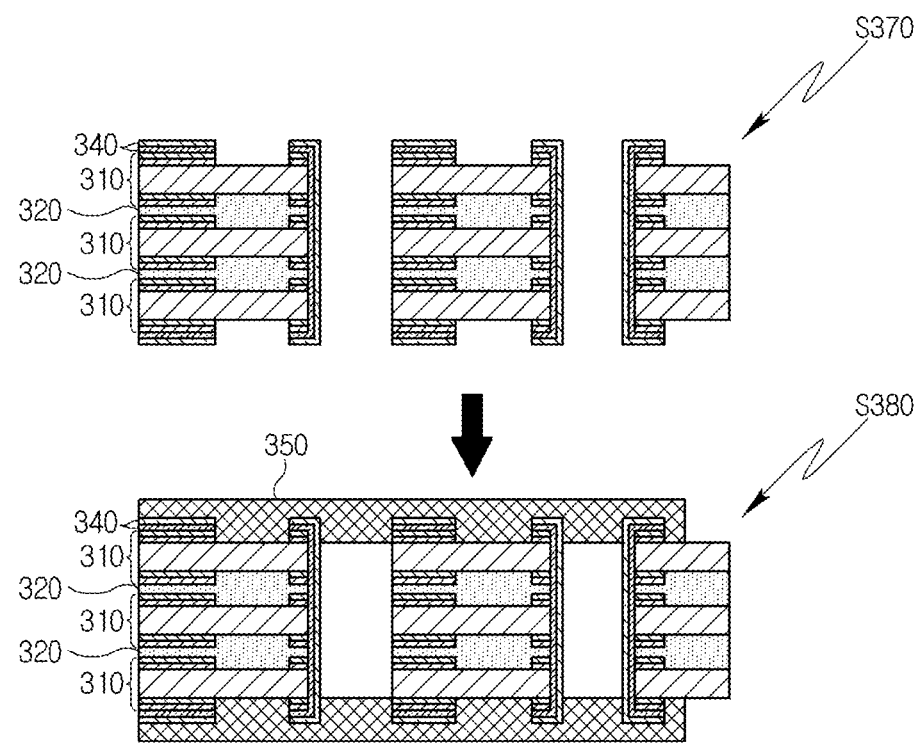

[FIG. 17]
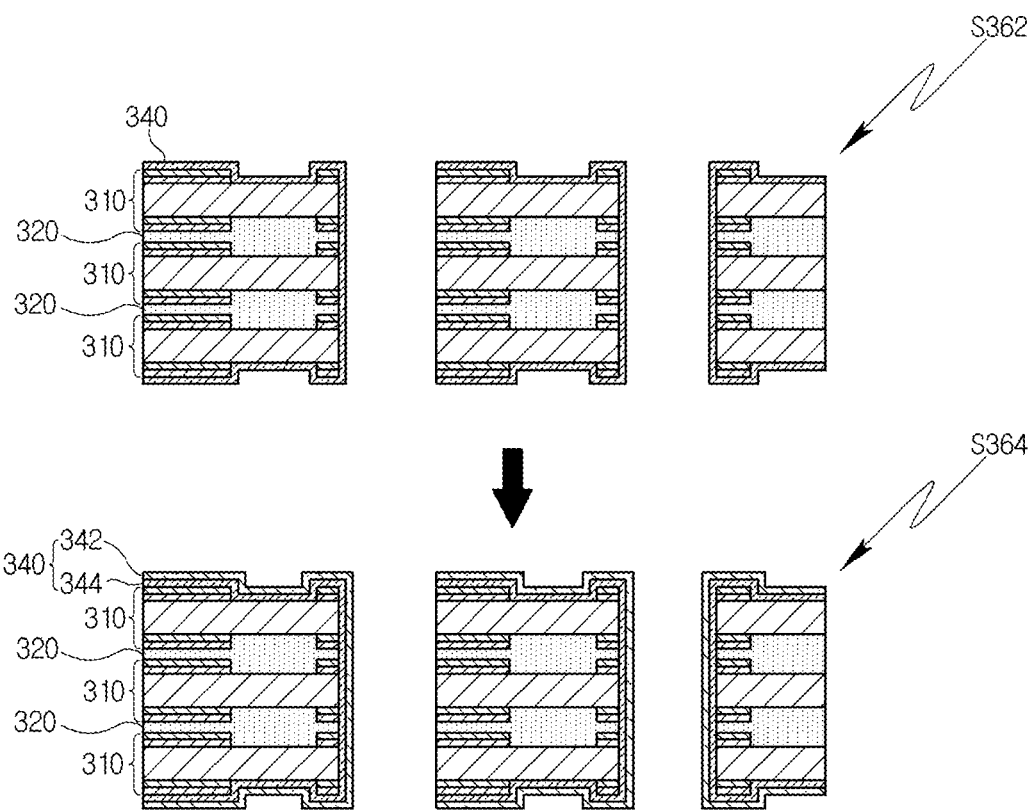
[FIG. 18]
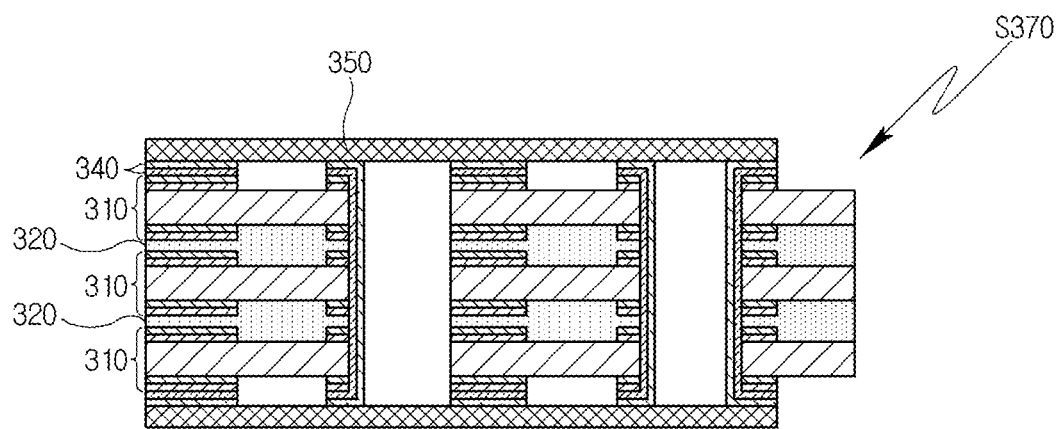

[FIG. 19]
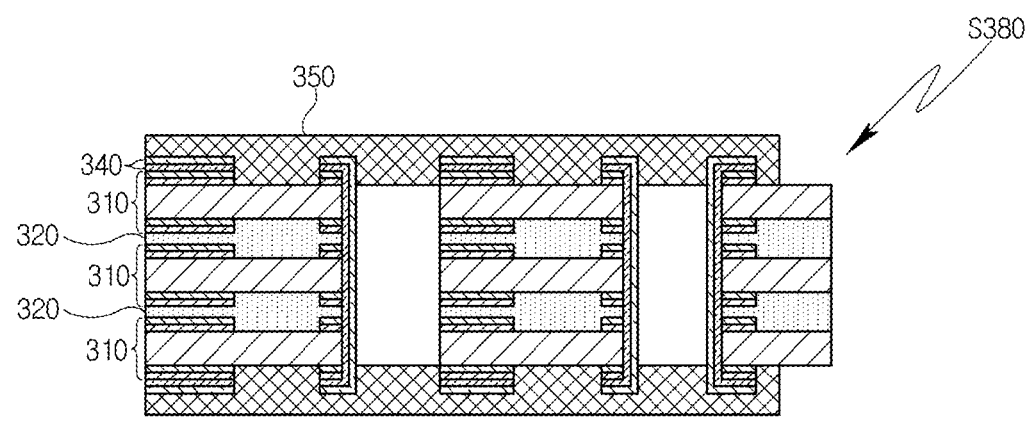

[FIG. 20]
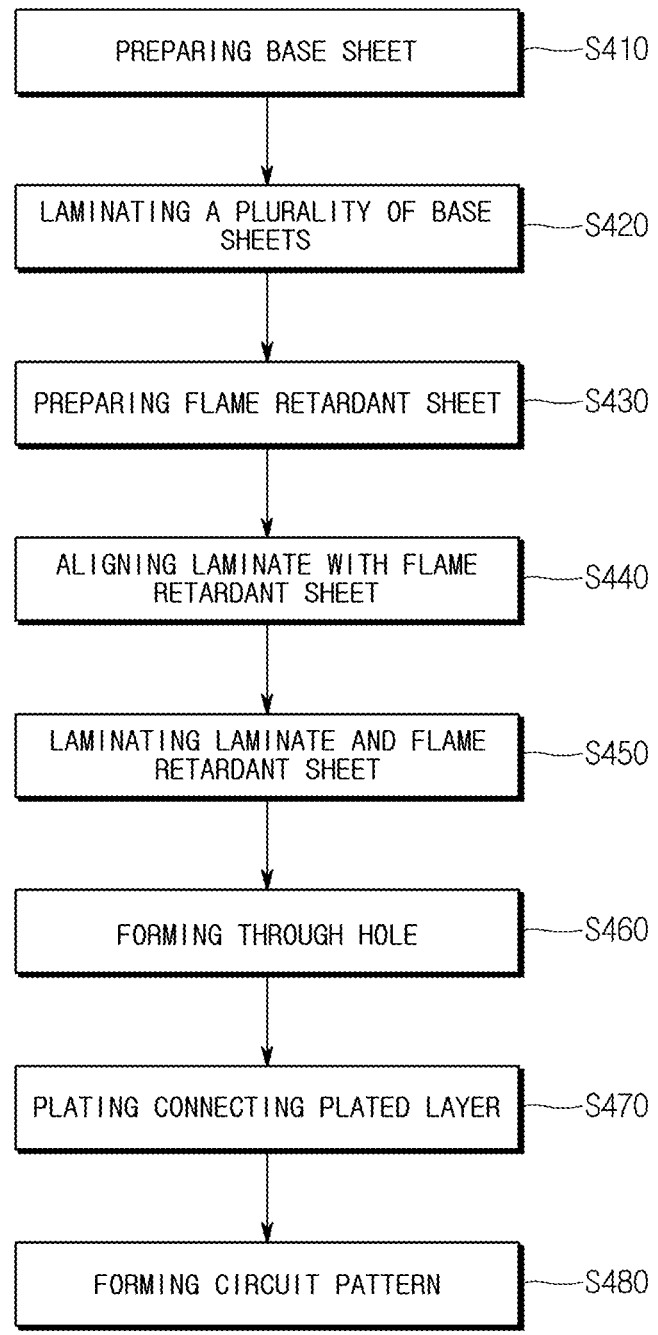

[FIG. 21]
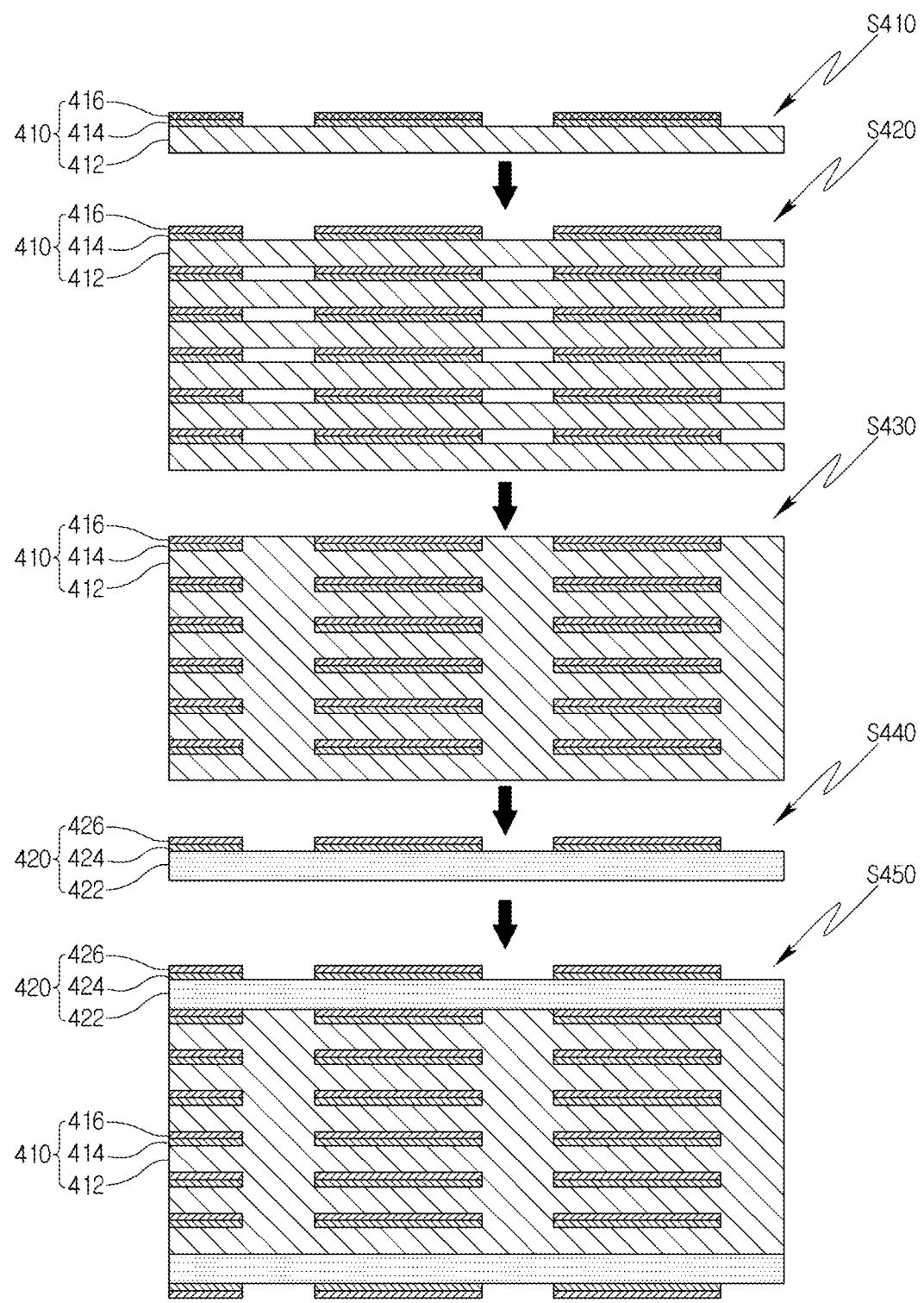

[FIG. 22]
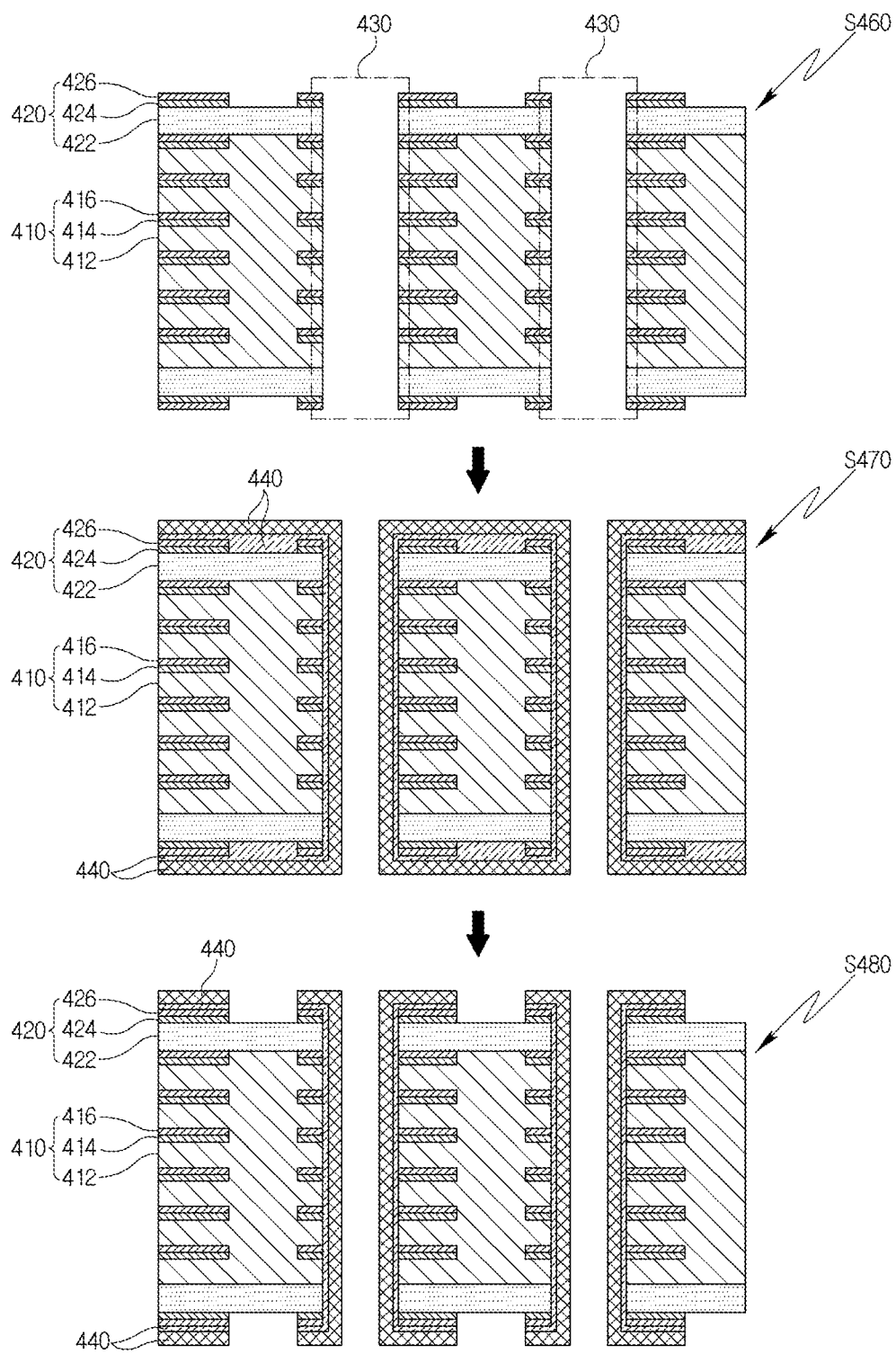

[FIG. 23]
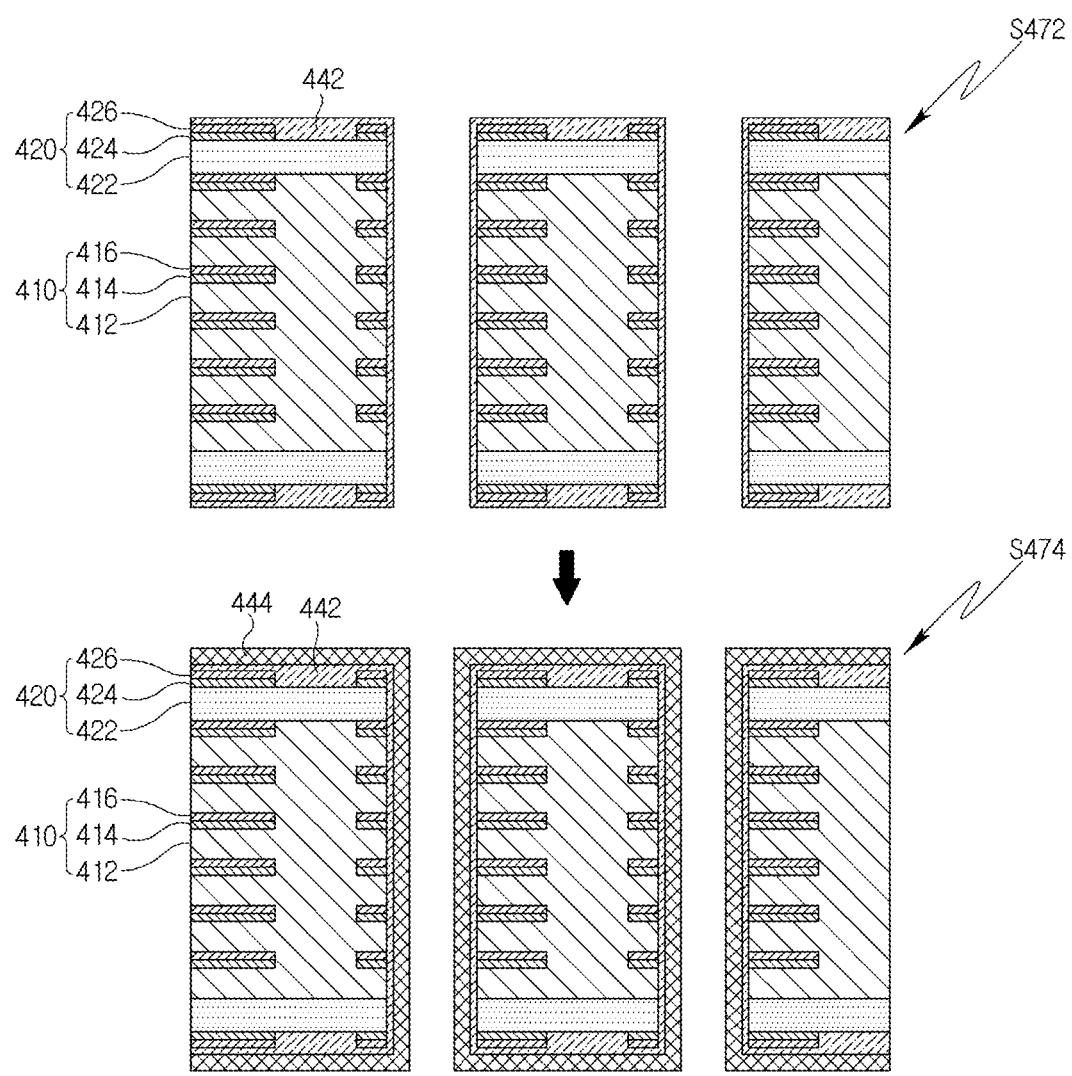

[FIG. 24]
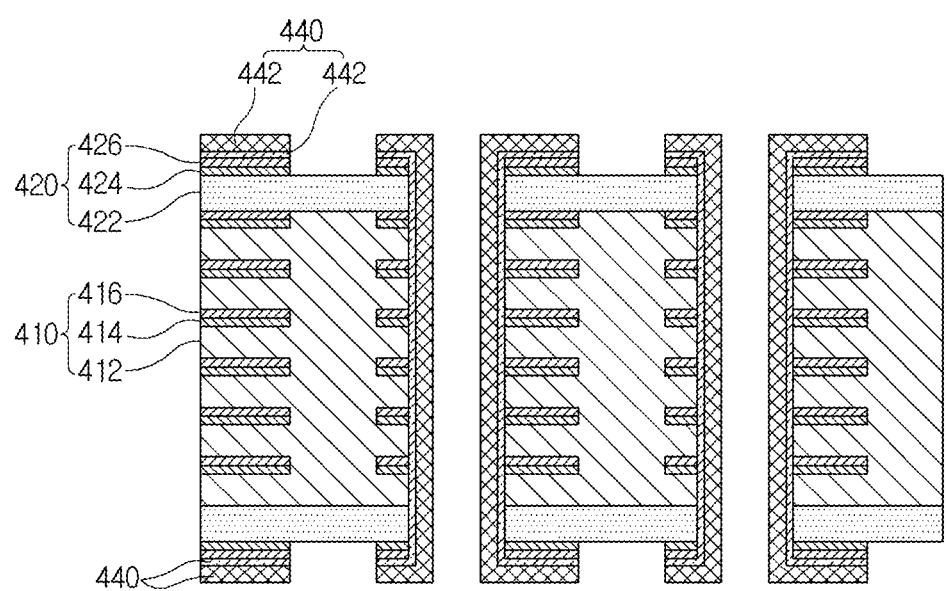

METHOD FOR MANUFACTURING FLEXIBLE PRINTED CIRCUIT BOARD AND FLEXIBLE PRINTED CIRCUIT BOARD MANUFACTURED BY SAME

CROSS-REFERENCE TO RELATED APPLICATIONS

This application is a National Stage of International patent application PCT/KR2017/009451, filed on Aug. 29, 2017, which claims priority to foreign Korean patent application Nos. KR 10-2016-0112070, KR 10-2016-0112071, KR 10-2016-0112072, KR 10-2016-0112073, and KR 10-2016-0112074 filed on Aug. 31, 2016, the disclosures of which are incorporated by reference in their entireties.

FIELD OF THE INVENTION

The present disclosure relates to a method for manufacturing a flexible printed circuit board and a flexible printed circuit board manufactured thereby, and more particularly, to a method for manufacturing a flexible printed circuit board used as a circuit using a high frequency and a flexible printed circuit board manufactured thereby.

BACKGROUND

In general, a flexible printed circuit board is a board capable of flexibly bending by forming a circuit pattern on a thin insulating film, and is widely used in a portable electronic device and an automated machine, a display product or the like that requires bending and flexibility when used by mounting therein.

The flexible printed circuit board is manufactured by adhering or die-casting a copper foil to a polyimide (PI) film. At this time, since the polyimide film has the characteristics such as high mechanical strength, heat resistance, insulation, and solvent resistance, it is widely used as a base board of the flexible printed circuit board.

Meanwhile, as the use of the services for transmitting large amount of information in real time such as a video call, watching a movie, and a live broadcast is increasing, the portable terminal is mounted with circuits for transmitting large capacity information by using a high frequency band (e.g., GHz) therein.

However, there is a problem in that when a high frequency signal is transmitted by using the flexible printed circuit board made of a polyimide film, a signal loss of the high frequency signal is caused by a dielectric loss that is inherent in the material.

That is, there is a problem in that the polyimide film has a high dielectric constant, a dielectric loss occurs during transmission and reception of the high frequency signal to cause a loss of a high frequency signal, thereby disconnecting the services in use such as a video call, watching a movie, and live broadcast.

In addition, there is a problem in that although the flexible printed circuit board made of a film having a low dielectric constant may minimize the loss of the high frequency signal, the heat resistance is reduced due to a low melting temperature, thereby melting the surface due to the high temperature of about 250° C. occurring in a Surface Mounter Technology (SMC) process for mounting an element for high frequency and occurring the failure.

In addition, there is a problem in that the film having a low dielectric constant and high heat-resistance is formed at a high price, such that the manufacturing cost of the flexible printed circuit board increases, thereby losing the market power.

SUMMARY OF THE INVENTION

The present disclosure is intended to solve the above problems, and an object of the present disclosure is to provide a method for manufacturing a flexible printed circuit board and a flexible printed circuit board manufactured thereby, which stacks a base sheet and an bonding sheet having a low dielectric constant thereon, and stacks a heat resistant sheet having a heat resistance on the uppermost portion and the lowermost portion thereof, thereby minimizing a dielectric loss due to a high frequency signal and preventing a loss of the high frequency signal.

That is, an object of the present disclosure is to provide a method for manufacturing a flexible printed circuit board and a flexible printed circuit board manufactured thereby, which stacks a base sheet made of polypropylene (PP) of a low dielectric constant and an bonding sheet made of polyethylene (PE) film or polypropylene (PP) of a low dielectric constant thereon, and stacks a heat resistant sheet made of polyimide (PI) of a high heat resistance on the uppermost portion and the lowermost portion thereof, thereby minimizing a dielectric loss due to a high frequency signal and preventing a loss of the high frequency signal.

Another object of the present disclosure is to provide a method for manufacturing a flexible printed circuit board and a flexible printed circuit board manufactured thereby, which stacks a base sheet and a bonding sheet having a low dielectric constant thereon, and forms an anisotropic conductive layer on the uppermost portion and the lowermost portion thereof, thereby minimizing a dielectric loss due to a high frequency signal and preventing a loss of the high frequency signal.

That is, another object of the present disclosure is to provide a method for manufacturing a flexible printed circuit board and a flexible printed circuit board manufactured thereby, which stacks a base sheet made of polypropylene of a low dielectric constant and an bonding sheet of a low dielectric constant thereon, and forms an anisotropic conductive layer made of an Anisotropic Conductive Paste (ACP) or an. Anisotropic Conductive Film (ACF) on the uppermost portion and the lowermost portion thereof, thereby minimizing a dielectric loss due to a high frequency signal and preventing a loss of the high frequency signal.

Still another object of the present disclosure is to provide a method for manufacturing a flexible printed circuit board and a flexible printed circuit board manufactured thereby, which stacks a flame retardant sheet having flame retardancy and a low dielectric constant on the upper surface and the lower surface of a laminate laminated by stacking a plurality of base sheets having a low dielectric constant, respectively, thereby minimizing a dielectric loss due to a high frequency signal and preventing a loss of the high frequency signal.

That is, still another object of the present disclosure is to provide a method for manufacturing a flexible printed circuit board and a flexible printed circuit board manufactured thereby, which stacks a flame retardant sheet made of FR4 having flame retardancy and a low dielectric constant on the upper surface and the lower surface of a laminate laminated by stacking a plurality of base sheets made of polypropylene (PP) of a low dielectric constant, respectively, thereby minimizing a dielectric loss due to a high frequency signal and preventing a loss of the high frequency signal.

For achieving the objects, a method for manufacturing a flexible printed circuit board according to an embodiment of the present disclosure includes preparing a base sheet; preparing a bonding sheet having the melting temperature lower than the melting temperature of the base sheet; forming a laminate by stacking the base sheet and the bonding sheet; and bonding by heating and pressurizing the laminate.

For achieving the objects, a method for manufacturing a flexible printed circuit board according to another embodiment of the present disclosure includes preparing a base sheet; laminating a plurality of base sheets; preparing a flame retardant sheet having the strength higher than that of the base sheet; aligning the flame retardant sheet on a laminate on which the base sheets are laminated; and laminating the laminate and the flame retardant sheet.

For achieving the objects, a flexible printed circuit board manufactured by a method for manufacturing a flexible printed circuit board according to an embodiment of the present disclosure includes a laminate on which a base sheet and a bonding sheet are laminated; and an electrode formed on at least one surface of the upper surface and the lower surface of the laminate, and the melting temperature of the bonding sheet is lower than the melting temperature of the base sheet.

For achieving the objects, a flexible printed circuit board manufactured by a method for manufacturing a flexible printed circuit board according to another embodiment of the present disclosure includes a laminate on which a plurality of base sheets are stacked; and a flame retardant sheet formed on at least one surface of the upper surface and the lower surface of the laminate, and the flame retardant sheet has the strength higher than that of the base sheet.

According to the present disclosure, it is possible for the method for manufacturing the flexible printed circuit board and the flexible printed circuit board manufactured thereby to stack the base sheet formed of a polypropylene (PP) film of a low dielectric constant and the bonding sheet formed of a polyethylene (PE) film or a polypropylene (PP) film of a low dielectric constant thereon, and to stack the heat resistant sheet formed of a polyimide (PI) film of a high heat resistance on the uppermost portion and the lowermost portion thereof, thereby minimizing a dielectric loss due to the high frequency signal and preventing a loss of the high frequency signal.

In addition, it is possible for the method for manufacturing the flexible printed circuit board and the flexible printed circuit board manufactured thereby to constitute a circuit by using the thin films such as the polypropylene film, the polyethylene film, and the polyimide film, thereby minimizing the thickness thereof while performing a high speed signal processing.

In addition, it is possible for the method for manufacturing the flexible printed circuit board and the flexible printed circuit board manufactured thereby to constitute the base sheet formed of the polypropylene (PP) film of a low dielectric constant, thereby minimizing a dielectric loss due to the high frequency signal and preventing a loss of the high frequency signal by forming a dielectric constant lower than that of the conventional flexible printed circuit board constituting the base sheet formed of the polyimide film.

In addition, it is possible for the method for manufacturing the flexible printed circuit board and the flexible printed circuit board manufactured thereby to constitute the bonding sheet formed of the polyethylene film of a low dielectric constant, manufacturing it in the form of the thin film while the printed circuit board forms a low dielectric constant to perform the high speed signal processing.

In addition, it is possible for the method for manufacturing the flexible printed circuit board and the flexible printed circuit board manufactured thereby to constitute the bonding sheet formed of the polypropylene film that is the same as the base sheet, thereby alleviating the condition of the surface mounter technology process using the flexible printed circuit board by increasing the heating temperature limitation of the Surface Mounter Technology (SMT) process.

In addition, it is possible for the method for manufacturing the flexible printed circuit board and the flexible printed circuit board manufactured thereby to stack the heat resistant sheet formed of the polyimide (PI) film of a high heat resistance on the uppermost portion and the lowermost portion thereof, thereby manufacturing the flexible printed circuit board having a high heat resistance together with a low dielectric constant.

That is, it is possible for the method for manufacturing the flexible printed circuit board and the flexible printed circuit board manufactured thereby to form the heat resistant sheet, which is stacked on the uppermost portion and the lowermost portion thereof, with a high heat resistant material such as polyimide or LCP in order to supplement a low heat resistance of a low dielectric constant material, thereby manufacturing the flexible printed circuit board having a high heat resistance together with a low dielectric constant.

In addition, it is possible for the method for manufacturing the flexible printed circuit board and the flexible printed circuit board manufactured thereby to form the anisotropic conductive layer on the electrode part, thereby electrically connecting the elements mounted on the upper portion of the flexible printed circuit board only to the electrode part, and preventing the electrode part and another electrode part from electrically being connected.

In addition, it is possible for the method for manufacturing the flexible printed circuit board and the flexible printed circuit board manufactured thereby to form the anisotropic conductive layer on the electrode part, thereby preventing the occurrence of short on the portion where the electrode part and the element are connected. That is, the anisotropic conductive film electrically conducts the element and the electrode part only in the thickness direction of the film, respectively, as heat and pressure are applied thereto in the process of bonding the element to the electrode part. As a result, it is possible to protect the connecting portion of the element and the electrode part, to increase durability, and to prevent the occurrence of short on the connecting portion therebetween.

In addition, it is possible for the method for manufacturing the flexible printed circuit board and the flexible printed circuit board manufactured thereby to stack the flame retardant sheet having flame retardancy and a low dielectric constant on the upper surface and the lower surface of the laminate laminated by stacking the plurality of base sheets having a low dielectric constant, respectively, thereby minimizing a dielectric loss due to the high frequency signal and preventing a loss of the high frequency signal.

In addition, it is possible for the method for manufacturing the flexible printed circuit board and the flexible printed circuit board manufactured thereby to constitute the circuit by using the thin films such as the polypropylene film and the FR4 film, thereby minimizing the thickness thereof while performing a high speed signal processing.

In addition, the method for manufacturing the flexible printed circuit board and the flexible printed circuit board manufactured thereby may manufacture the flexible printed circuit board having flame retardancy together with a low dielectric constant forming the flame retardant sheet on the uppermost portion and the lowermost portion thereof.

In addition, it is possible for the method for manufacturing the flexible printed circuit board and the flexible printed circuit board manufactured thereby to stack the hard flame retardant sheet on the upper surface and the lower surface of the flexible laminate of the base sheet, thereby securing the mechanical strength (i.e., hardness) of the printed circuit board.

BRIEF DESCRIPTION OF THE DRAWINGS

FIGS. 1 to 3 are diagrams for explaining a method for manufacturing a flexible printed circuit board according to a first embodiment of the present disclosure.

FIG. 4 is a diagram for explaining plating a connecting plated layer of FIG. 1.

FIGS. 5 and 6 are diagrams for explaining the flexible printed circuit board according to the first embodiment of the present disclosure.

FIGS. 7 to 9 are diagrams for explaining a method for manufacturing a flexible printed circuit board according to a second embodiment of the present disclosure.

FIG. 10 is a diagram for explaining plating a connecting plated layer of FIG. 7.

FIGS. 11 and 12 are diagrams for explaining the flexible printed circuit board according to the second embodiment of the present disclosure.

FIGS. 13 to 16 are diagrams for explaining a method for manufacturing a flexible printed circuit board according to a third embodiment of the present disclosure, FIG. 17 is a diagram for explaining plating a connecting plated layer of FIG. 13, FIG. 18 is a diagram for explaining forming an anisotropic conductive layer of FIG. 13.

FIG. 19 is a diagram for explaining the flexible printed circuit board according to the third embodiment of the present disclosure.

FIGS. 20 to 22 are diagrams for explaining a method for manufacturing a flexible printed circuit board according to a fourth embodiment of the present disclosure.

FIG. 23 is a diagram for explaining plating a connecting plated layer of FIG. 20.

FIG. 24 is a diagram for explaining a printed circuit board according to the fourth embodiment of the present disclosure.

DETAILED DESCRIPTION

Hereinafter, the most preferred embodiment of the present disclosure will be described with reference to the accompanying drawings so that those skilled in the art to which the present disclosure pertains may easily practice the technical spirit of the present disclosure. First, in adding reference numerals to the components in each drawing, it is to be noted that the same components are denoted by the same reference numerals even though they are illustrated in different drawings. In addition, in the following description of the present disclosure, a detailed description of relevant known configurations or functions will be omitted when it is determined to obscure the subject matter of the present disclosure.

Referring to FIGS. 1 to 3, a method for manufacturing a flexible printed circuit board according to a first embodiment of the present disclosure includes preparing a base sheet 110 S110, preparing a bonding sheet 120 S120, preparing a heat resistant sheet 130 S130, stacking the base sheet 110, the bonding sheet 120, and the heat resistant sheet 130 S140, hot pressing S150, forming a through hole 140 S160, plating a connecting plated layer 150 S180, and forming a circuit pattern S180.

The preparing the base sheet 110 S110 prepares a polypropylene (PP) film of a low dielectric constant (hereinafter, referred to as a PP film 112). At this time, the PP film 112 is formed to have a thickness of about 40 μm.

The preparing the base sheet 110 S110 forms a thin film seed layer 114 on the PP film 112. At this time, the thin film seed layer 114 is formed on at least one surface of the upper surface and the lower surface of the PP film 112 through a deposition process or a sputtering process. At this time, the thin film seed layer 114 may be made of a mixed material mixing nickel copper NiCu and copper Cu or a nickel copper NiCu material.

The preparing the base sheet 110 S110 forms an internal plated layer 116 on the thin film seed layer 114. At this time, the preparing the base sheet 110 S110 forms the internal plated layer 116 on the thin film seed layer 114 by electrolytically plating copper Cu.

The preparing the base sheet 110 S110 forms an electrode by removing a part of the thin film seed layer 114 and a part of the internal plated layer 116 through a masking and etching process. At this time, the thin film seed layer 114 and the internal plated layer 116 are used as internal electrodes and circuits of the flexible printed circuit board, and are formed to have a thickness of about 3 μm.

The preparing the bonding sheet 120 S120 prepares the bonding sheet 120 made of a thin film formed of a polyethylene (PE) film of a low dielectric constant (hereinafter, referred to as a PE film). At this time, the bonding sheet 120 is formed to have a thickness of about 40 μm.

The preparing the bonding sheet 120 S120 may also prepare the bonding sheet 120 made of the thin film formed of the polypropylene film of a low dielectric constant in the same manner as the base sheet 110.

The preparing the heat resistant sheet 130 S130 prepares a polyimide (PI) film of a high heat resistance (hereinafter, referred to as a PI film 132). The heat resistant sheet 130 may also be formed of a liquid crystal polymer (LCP) sheet. At this time, the heat resistant sheet 130 may be formed to have a thickness of about 50 μm.

The preparing the heat resistant sheet 130 S130 forms an external plated layer 134 by printing copper on the PI film 132. That is, the preparing the heat resistant sheet 130 S130 forms the external plated layer 134 by printing copper on one surface (upper surface or lower surface) of the PI film 132 through a laminating process. At this time, the external plated layer 134 is used as an external electrode, and is formed to have a thickness of about 12 μm.

The stacking S140 stacks the base sheet 110, the bonding sheet 120, and the heat resistant sheet 130. That is, the stacking S140 stacks the heat resistant sheet 130 on the upper surface and the lower surface of the base sheet 110. At this time, the stacking S140 stacks the bonding sheet 120 between the base sheet 110 and the heat resistant sheet 130.

The stacking S140 may also stack a plurality of base sheets 110, the bonding sheet 120, and the heat resistant sheet 130. That is, the stacking S140 stacks the plurality of base sheets 110, and stacks the heat resistant sheet 130 on the lower portion of the base sheet 110 stacked on the uppermost portion and the lowermost portion of the base sheet 110 stacked on the upper most portion thereof. At this time, the stacking S140 stacks the bonding sheet 120 between the base sheets 110, and between the base sheet 110 and the heat resistant sheet 130.

For example, when manufacturing a flexible printed circuit board by using two base sheets 110, the stacking S140 stacks a first bonding sheet 120 between a first base sheet 110 and a second base sheet 110. The stacking S140 stacks a second bonding sheet 120 on the upper portion of the first base sheet 110, and stacks a third bonding sheet 120 on the lower portion of the second base sheet 110. Thereafter, the stacking S140 stacks a first heat resistant sheet 130 on the upper portion of the second bonding sheet 120, and stacks a second heat resistant sheet 130 on the lower portion of the third bonding sheet 120.

The hot pressing S150 bonds (compresses) the base sheet 110, the bonding sheet 120, and the heat resistant sheet 130 by applying heat and pressure thereto in a state where the base sheet 110, the bonding sheet 120, and the heat resistant sheet 130 have been stacked. At this time, the hot pressing S150 bonds (compresses) the base sheet 110, the bonding sheet 120, and the heat resistant sheet 130 by pressing while heating it with the heat of the melting temperature or more of the thermoplastic bonding sheet 120.

Herein, the PE film used as the bonding sheet 120 has the melting temperature of about 138° C., the PP film 112 used as the base sheet 110 has the melting temperature of about 165° C., and the PI film used as the heat resistant sheet 130 has the melting temperature of about 350° C., such that the hot pressing S150 pressurizes while heating it at about 138° C. or more and lower than 165° C.

Therefore, the hot pressing S150 bonds (compresses) the base sheet 110 and the base sheet 110, and the base sheet 110 and the heat resistant sheet 130 by melting only the PE film as the bonding sheet 120 while preventing the PP film 112 as the base sheet 110 and the PI film 132 as the heat resistant sheet 130 from melting.

The forming the through hole 140 S160 forms one or more through holes 140 penetrating the laminate bonded through the hot pressing S150. That is, the forming the through hole 140 S160 forms one or more through holes 140 for electrically connecting electrically conducting) the internal electrode and the external electrode by punching the laminate.

The plating the connecting plated layer 150 S180 plates the through hole 140 and the surfaces of the heat resistance sheets 130 of the uppermost portion and the lowermost portion thereof. That is, the plating the connecting plated layer 150 S180 plates the connecting plated layer 150 for electrically connecting (i.e., electrically conducting) the internal electrode and the external electrode through the through hole 140.

Referring to FIG. 4, the plating the connecting plated layer 150 S180 may include plating a first connecting plated layer 152 S172 and plating a second connecting plated layer 154 S174.

The plating the first connecting plated layer 152 S172 forms the first connecting plated layer 152 by plating copper on the inner wall of the through hole 140 and the surface of the heat resistant sheet 130 in order to electrically connect (i.e., form electrical-conductivity) the internal electrode (i.e., the thin film seed layer 114 and the internal plated layer 116 of the base sheet 110) and the external electrode (i.e., the external plated layer 134 of the heat resistant sheet 130) through electroless chemical copper plating.

The plating the second connecting plated layer 154 S174 forms the second connecting plated layer 154 on the surface of the first connecting plated layer 152 through electrolytic copper plating. Therefore, the second connection plating layer 154 reinforces the electrical connection (i.e., electrical-conductivity) of the first connecting plated layer 152.

The forming the circuit pattern S180 forms a circuit pattern on the upper surface and the lower surface of the printed circuit board by etching the connecting plated layer 150 and the external plated layer 134. That is, the forming the circuit pattern S180 forms the circuit pattern by removing a part of the connecting plated layer 150 and a part of the external plated layer 134 through a masking process and an etching process.

Meanwhile, the method for manufacturing the flexible printed circuit board may further include forming a protective layer on the upper portion and the lower portion of the flexible printed circuit board on which the circuit is formed.

The forming the protective layer forms a protective layer for covering and protecting the surfaces of the circuit pattern and the heat resistant member by curing after applying a liquid-state coating fluid on the surfaces of the circuit pattern and the heat resistant member.

At this time, it is preferable that the protective layer is formed of a synthetic resin coating layer by using the same series of coating fluid as that of the heat resistant member, thereby having an excellent adhesive force with the heat resistant member and being more firmly integrated with the heat resistant member. Since the heat resistant member is formed of the PI film 132, the protective layer may be a PI coating layer or a PAI coating layer, for example.

In addition, the method for manufacturing the flexible printed circuit board may further include forming a terminal part. At this time, the forming the terminal part may form a terminal part by plating a conductive material such as copper on the corresponding region after removing a part of the protective layer.

Referring to FIG. 5, the flexible printed circuit board manufactured by the method for manufacturing the flexible printed circuit board according to a first embodiment of the present disclosure is configured by stacking the heat resistant sheets 130 on the upper surface and the lower surface of the base sheet 110. At this time, the flexible printed circuit board is configured by bonding the base sheet 110 and the heat resistant sheets 130 with the bonding sheet 120 interposed between the base sheet 110 and the heat resistant sheets 130.

The base sheet 110 is formed of the PP film 112 having the melting temperature higher than that of the bonding sheet 120 and having a low dielectric constant. The base sheet 110 has an internal electrode formed by removing a part of the thin film seed layer 114 and a part of the internal plated layer 116 formed on at least one surface of the upper surface and the lower surface thereof. At this time, since the flexible printed circuit board is used as a circuit using a high frequency, the base sheet 110 is preferably formed of the PP film 112 having a low dielectric constant.

The heat resistant sheet 130 is stacked on the upper portion and the lower portion of the base sheet 110 in order to prevent the flexible printed circuit board from being damaged (melted) at a high temperature of about 250° C. generated in a Surface Mounter Technology (SMT) process for mounting an element (e.g., a semiconductor for high frequency). Therefore, the heat resistant sheet 130 is formed of the PI film 132, which is a heat resistant material having a higher melting temperature than the high temperature generated in the SMT process.

The bonding sheet 120 is a material for bonding the base sheet 110 and the heat resistant sheet 130 when the flexible printed circuit board is manufactured, and bonds the base sheet 110 and the heat resistant sheet 130 through a heating and pressurizing process. The bonding sheet 120 is melted by the high temperature applied during the heating and pressurizing process to bond the base sheet 110 and the heat resistant sheet 130.

At this time, since the flexible printed circuit board is used as a circuit using a high frequency, the bonding sheet 120 has a low dielectric constant and is preferably formed of the PE film having the melting temperature relatively lower than the melting temperature of the PP film 112 used as the base sheet 110. The melting temperature of the PE film is lower than the melting temperature of the PP film.

Of course, since the flexible printed circuit board is used as a circuit using a high frequency, the bonding sheet 120 may also be formed of a polypropylene film having a low dielectric constant. As the base sheet 110 and the bonding sheet 120 are formed of a polypropylene film, the temperature that may be applied to the flexible printed circuit board in the SMT process increases, thereby alleviating the restricted condition on the heating temperature in the SMT process.

Meanwhile, referring to FIG. 6, the flexible printed circuit board may be configured by stacking the plurality of base sheets 110, and stacking the heat resistant sheets 130 on the upper surface of the base sheet 110 disposed on the uppermost portion thereof and the lower surface of the base sheet 110 disposed on the lowermost portion thereof. At this time, the flexible printed circuit board is configured by bonding the plurality of base sheets 110 and the heat resistant sheets 130 with the bonding sheet 130 interposed between the base sheet 110 and another base sheet 110, and between the base sheet 110 and the heat resistant sheets 130.

Herein, the heat resistant sheet 130 (i.e., the PI film 132) has the highest dielectric constant and heat resistance, and the base sheet 110 (i.e., the PP film 112) has the lowest dielectric constant and has heat resistance higher than that of the bonding sheet 120 (i.e., the PE film). The bonding sheet 120 has a dielectric constant lower than that of the heat resistant sheet 130 and higher than that of the base sheet 110 and has the lowest heat resistance.

As described above, it is possible for the method for manufacturing the flexible printed circuit board and the flexible printed circuit board manufactured thereby to stack the base sheet formed of the polypropylene (PP) film of a low dielectric constant and the bonding sheet formed of the polyethylene (PE) film or the polypropylene film of a low dielectric constant thereon, and to stack the heat resistant sheet formed of the polyimide (PI) film of a high heat resistance on the uppermost portion and the lowermost portion thereof, thereby minimizing a dielectric loss due to the high frequency signal and preventing a loss of the high frequency signal.

In addition, it is possible for the method for manufacturing the flexible printed circuit board and the flexible printed circuit board manufactured thereby to constitute a circuit by using the thin films such as the polypropylene film, the polyethylene film, and the polyimide film, thereby minimizing the thickness thereof while performing a high speed signal processing.

In addition, it is possible for the method for manufacturing the flexible printed circuit board and the flexible printed circuit board manufactured thereby to constitute the base sheet formed of the polypropylene (PP) film of a low dielectric constant, thereby minimizing a dielectric loss and performing a high speed signal processing of a high frequency signal by forming a dielectric constant lower than that of the conventional flexible printed circuit board constituting the base sheet formed of the polyimide film.

In addition, it is possible for the method for manufacturing the flexible printed circuit board and the flexible printed circuit board manufactured thereby to constitute the bonding sheet formed of the polyethylene film of a low dielectric constant, thereby manufacturing it in the form of the thin film while the printed circuit board forms a low dielectric constant to perform the high speed signal processing.

In addition, it is possible for the method for manufacturing the flexible printed circuit board and the flexible printed circuit board manufactured thereby to constitute the bonding sheet formed of the polypropylene film that is the same as the base sheet, thereby alleviating the condition of the surface mounter technology process using the flexible printed circuit board by increasing the heating temperature limitation of the Surface Mounter Technology (SMT) process.

In addition, it is possible for the method for manufacturing the flexible printed circuit board and the flexible printed circuit board manufactured thereby to stack the heat resistant sheet formed of the polyimide (PI) film of a high heat resistance on the uppermost portion and the lowermost portion thereof, thereby manufacturing the flexible printed circuit board having a high heat resistance together with a low dielectric constant.

That is, it is possible for the method for manufacturing the flexible printed circuit board and the flexible printed circuit board manufactured thereby to form the heat resistant sheet, which is stacked on the uppermost portion and the lowermost portion thereof, with a high heat resistant material such as polyimide or LCP in order to supplement a low heat resistance of a low dielectric constant material, thereby manufacturing the flexible printed circuit board having a high heat resistance together with a low dielectric constant.

Referring to FIGS. 7 to 9, a method for manufacturing a flexible printed circuit board according to a second embodiment of the present disclosure includes preparing a base sheet 210 S210, preparing a bonding sheet 220 S220, preparing a heat resistant sheet 230 S230, preparing a heat blocking sheet 240 S240, stacking the base sheet 210, the bonding sheet 220, and the heat resistant sheet 230 S250, hot pressing S260, forming a through-hole S270, plating a connecting plated layer 260 S280, and forming a circuit pattern S290.

The preparing the base sheet 210 S210 prepares a polypropylene (PP) film of a low dielectric constant (hereinafter, referred to as a PP film 212). At this time, the PP film 212 is formed to have a thickness of about 40 μm.

The preparing the base sheet 210 S210 forms a thin film seed layer 214 on the PP film 212. At this time, the thin film seed layer 214 is formed on at least one surface of the upper surface and the lower surface of the PP film 212 through a deposition process or a sputtering process. At this time, the thin film seed layer 214 may be made of a mixed material mixing nickel copper NiCu and copper Cu or a nickel copper NiCu material.

The preparing the base sheet 210 S210 forms an internal plated layer 216 on the thin film seed layer 214. At this time, the preparing the base sheet 210 S210 forms the internal plated layer 216 on the thin film seed layer 214 by electrolytically plating copper Cu.

The preparing the base sheet 210 S210 forms an electrode by removing a part of the thin film seed layer 214 and a part of the internal plated layer 216 through a masking and etching process. At this time, the thin film seed layer 214 and the internal plated layer 216 are used as internal electrodes and circuits of the flexible printed circuit board, and are formed to have a thickness of about 3 μm.

The preparing the bonding sheet 220 S220 prepares the bonding sheet 220 formed of a thin film formed of a polyethylene (PE) film of a low dielectric constant (hereinafter, referred to as a PE film). At this time, the bonding sheet 220 is formed to have a thickness of about 40 μm.

The preparing the heat resistant sheet 230 S230 prepares a polyimide (PI) film of a high heat resistance (hereinafter, referred to as a PI film 232). The heat resistant sheet 230 may be formed of a liquid crystal polymer (LCP) sheet. At this time, the heat resistant sheet 230 may be formed to have a thickness of about 50 μm.

The preparing the heat resistant sheet 230 S230 forms an external plated layer 234 by printing copper on the PI film 232. That is, the preparing the heat resistant sheet 230 S230 forms the external plated layer 234 by printing copper on one surface (upper surface or lower surface) of the PI film 232 through a laminating process. At this time, the external plated layer 234 is a layer used as an external electrode, and is formed to have a thickness of about 12 μm.

The preparing the heat blocking sheet 240 S240 prepares the heat blocking sheet 240 for preventing the flexible printed circuit board from being damaged by the heat generated in the hot pressing S260, the surface mounter technology process, and the like by being interposed between the heat resistant sheet 230 and the bonding sheet 220. At this time, the heat blocking sheet 240 is formed of a material having heat resistance equal to or higher than that of the heat resistant member 230. The melting temperature of the heat blocking sheet 240 may be equal to or higher than the melting temperature of the heat resistant member 230.

The stacking S250 stacks the base sheet 210, the bonding sheet 220, and the heat resistant sheet 230. That is, the stacking S250 stacks the heat resistant sheet 230 on the upper surface and the lower surface of the base sheet 210. At this time, the stacking S250 stacks the bonding sheet 220 between the base sheet 210 and the heat resistant sheet 230. At this time, the stacking S250 interposes (stacks) the heat blocking sheet 240 between the heat resistant sheet 230 and the bonding sheet 220.

The stacking S250 may stack a plurality of base sheets 210, the bonding sheet 220, the heat resistant sheet 230, and the heat blocking sheet 240. That is, the stacking S250 stacks the plurality of base sheets 210, and stacks the heat resistant sheet 230 on the lower portion of the base sheet 210 stacked on the uppermost portion and the lowermost portion of the base sheet 210. At this time, the stacking S250 stacks the bonding sheet 220 between the base sheets 210, and between the base sheet 210 and the heat resistant sheet 230. Herein, the stacking S250 interposes (stacks) the heat blocking sheet 240 between the bonding sheet 220 and the heat resistant sheet 230.

For example, when manufacturing the flexible printed circuit board by using two base sheets 210, the stacking S250 may include a first bonding sheet 220 between a first base sheet 210 and a second base sheet 210. The stacking S250 stacks a second bonding sheet 220 on the upper portion of the first base sheet 210, and stacks a third bonding sheet 220 on the lower portion of the second base sheet 210.

Thereafter, the stacking S250 sequentially stacks a first heat blocking sheet 240 and a first heat resistant sheet 230 on the upper portion of the second bonding sheet 220, and sequentially stacks a second heat blocking sheet 240 and a second heat resistant sheet 230 on the lower portion of the third bonding sheet 220.

The hot pressing S260 bonds (compresses) the base sheet 210, the bonding sheet 220, the heat resistant sheet 230, and the heat blocking sheet 240 by applying heat and pressure thereto in a state where the base sheet 210, the bonding sheet 220, the heat resistant sheet 230, and the heat blocking sheet 240 have been stacked thereon. At this time, the hot pressing S260 bonds (compresses) the base sheet 210, the bonding sheet 220, the heat resistant sheet 230, and the heat blocking sheet 240 by pressurizing while heating it with the heat of the melting temperature or more of the thermoplastic bonding sheet 220.

Herein, the PE film used as the bonding sheet 220 has the melting temperature of about 138° C., the PP film 212 used as the base sheet 210 has the melting temperature of about 165° C., and the PI film used as the heat resistant sheet 230 has the melting temperature of about 350° C., such that the hot pressing S260 pressurizes while heating it at about 138° C. or more and lower than 165° C.

Therefore, the hot pressing S260 bonds (compresses) the base sheet 210 and the base sheet 210, and the base sheet 210, the heat resistant sheet 230, and the heat blocking sheet 240 by melting only the PR film as the bonding sheet 220 while preventing the PP film 212 as the base sheet 210 and the PI film 232 as the heat resistant sheet 230 from melting.

The forming the through hole 250 S270 forms one or more through holes 250 penetrating the laminate bonded through the hot pressing S260. That is, the forming the through hole 250 S270 forms one or more through holes 250 for electrically connecting (i.e., electrically conducting) the internal electrode and the external electrode by punching the laminate.

The plating the connecting plated layer 260 S280 plates the through hole 250 and the surfaces of the heat resistance sheets 230 of the uppermost portion and the lowermost portion thereof. That is, the plating the connecting plated layer 260 S280 plates the connecting plated layer 260 for electrically connecting (i.e., electrically conducting) the internal electrode and the external electrode through the through hole 250.

Referring to FIG. 10, the plating the connecting plated layer 260 S280 may include plating a first connecting plated layer 620 S282 and plating a second connecting plated layer 640 S284.

The plating the first connecting plated layer 620 S282 forms the first connecting plated layer 620 by plating copper on the inner wall of the through hole 250 and the surface of the heat resistant sheet 230 in order to electrically connect (i.e., form electrical-conductivity) the internal electrode (i.e., the thin film seed layer 214 and the internal plated layer 216 of the base sheet 240) and the external electrode (i.e., the external plated layer 234 of the heat resistant sheet 230) through electroless chemical copper plating.

The plating the second connecting plated layer 640 S284 forms the second connecting plated layer 640 on the surface of the first connecting plated layer 620 through electrolytic copper plating. Therefore, the second connection plating layer 640 reinforces the electrical connection (i.e., electrical-conductivity) of the first connecting plated layer 620.

The forming the circuit pattern S290 forms a circuit pattern on the upper surface and the lower surface of the printed circuit board by etching the connecting plated layer 260 and the external plated layer 234. That is, the forming the circuit pattern S290 forms the circuit pattern by removing a part of the connecting plated layer 260 and a part of the external plated layer 234 through a masking process and an etching process.

Meanwhile, the method for manufacturing the flexible printed circuit board may further include forming a protective layer on the upper portion and the lower portion of the flexible printed circuit board on which the circuit is formed.

The forming the protective layer forms a protective layer for covering and protecting the surfaces of the circuit pattern and the heat resistant member by curing after applying a liquid-state coating fluid on the surfaces of the circuit pattern and the heat resistant member.

At this time, it is preferable that the protective layer is formed of a synthetic resin coating layer by using the same series of coating fluid as that of the heat resistant member, thereby having an excellent adhesive force with the heat resistant member and being more firmly integrated with the heat resistant member. Since the heat resistant member is formed of the PI film 232, the protective layer may be a PI coating layer or a PAI coating layer, for example.

In addition, the method for manufacturing the flexible printed circuit board may further include forming a terminal part. At this time, the forming the terminal part may form a terminal part by plating a conductive material such as copper on the corresponding region after removing a part of the protective layer.

Referring to FIG. 11, the flexible printed circuit board manufactured by the method for manufacturing the flexible printed circuit board according to a second embodiment of the present disclosure is configured by stacking the heat resistant sheets 230 on the upper surface and the lower surface of the base sheet 210. At this time, the flexible printed circuit board is configured by bonding the base sheet 210 and the heat resistant sheets 230 with the bonding sheet 220 interposed between the base sheet 210 and the heat resistant sheets 230, and has the heat blocking sheet 240 interposed between the bonding sheet 220 and the heat resistant sheet 230.

The base sheet 210 is formed of the PP film 212 having the melting temperature higher than that of the bonding sheet 220 and having a low dielectric constant. The base sheet 210 has an internal electrode formed by removing a part of the thin film seed layer 214 and a part of the internal plated layer 216 formed on at least one surface of the upper surface and the lower surface thereof. At this time, since the flexible printed circuit board is used as a circuit using a high frequency, the base sheet 210 is preferably formed of the PP film 212 having a low dielectric constant.

The heat resistant sheet 230 is stacked on the upper portion and the lower portion of the base sheet 210 in order to prevent the flexible printed circuit board from being damaged (melted) at a high temperature of about 250° C. generated in a Surface Mounter Technology (SMT) process for mounting an element (e.g., a semiconductor for high frequency). Therefore, the heat resistant sheet 230 is formed of the PI film 232, which is a heat resistant material having a higher melting temperature than the high temperature generated in the SMT process.

The bonding sheet 220 is a material for bonding the base sheet 210 and the heat resistant sheet 230 when the flexible printed circuit board is manufactured, and bonds the base sheet 210 and the heat resistant sheet 230 through a heating and pressurizing process. The bonding sheet 220 is melted by the high temperature applied during the heating and pressurizing process to bond the base sheet 210 and the heat resistant sheet 230.

At this time, since the flexible printed circuit board is used as a circuit using a high frequency, the bonding sheet 220 has a low dielectric constant and is preferably formed of the PE film having the melting temperature relatively lower than the melting temperature of the PP film 212 used as the base sheet 210.

Referring to FIG. 12, the flexible printed circuit board may also be configured by stacking a plurality of base sheets 210 thereon, and stacking the heat resistant sheets 230 on the upper surface of the base sheet 210 disposed on the uppermost portion thereof and the lower surface of the base sheet 210 disposed on the lowermost portion thereof. At this time, the flexible printed circuit hoard is configured by stacking the plurality of base sheets 210 and the heat resistant sheets 230 with the bonding sheet 220 interposed between the base sheet 210 and another base sheet 210, and the base sheet 210 and the heat resistant sheets 230.

Herein, the heat resistant sheet 230 (i.e., the PI film 232) has the highest dielectric constant and heat resistance, and the base sheet 210 (i.e., the PP film 212) has the lowest dielectric constant and has the heat resistance higher than that of the bonding sheet 220 (i.e., the PE film). The bonding sheet 220 has a dielectric constant lower than that of the heat resistant sheet 230 and higher than that of the base sheet 210 and has the lowest heat resistance.

The heat blocking sheet 240 is interposed (stacked) between the bonding sheet 220 and the heat resistant sheet 230. At this time, the heat blocking sheet 240 is a configuration for preventing the flexible printed circuit board from being damaged due to the heat generated in the hot pressing S260, the surface mounter technology process, and the like, and is formed of a material having heat resistance equal to or higher than that of the heat resistant sheet 230.

As described above, it is possible for the method for manufacturing the flexible printed circuit board and the flexible printed circuit board manufactured thereby to stack the base sheet formed of the polypropylene (PP) film of a low dielectric constant and the bonding sheet formed of the polyethylene (PE) film of a low dielectric constant thereon, and to stack the heat resistant sheet formed of the polyimide (PI) film of a high heat resistance on the uppermost portion and the lowermost portion thereof, thereby minimizing a dielectric loss due to the high frequency signal and preventing a loss of the high frequency signal.

In addition, it is possible for the method for manufacturing the flexible printed circuit board and the flexible printed circuit board manufactured thereby to constitute a circuit by using the thin films such as the polypropylene film, the polyethylene film, and the polyimide film, thereby minimizing the thickness thereof while performing a high speed signal processing.

In addition, it is possible for the method for manufacturing the flexible printed circuit board and the flexible printed circuit board manufactured thereby to constitute the base sheet formed of the polypropylene (PP) film of a low dielectric constant, thereby minimizing a dielectric loss and performing a high speed signal processing of a high frequency signal by forming a dielectric constant lower than that of the conventional flexible printed circuit board constituting the base sheet formed of the polyimide film.

In addition, it is possible for the method for manufacturing the flexible printed circuit board and the flexible printed circuit board manufactured thereby to constitute the bonding sheet formed of the polyethylene film of a low dielectric constant, thereby manufacturing it in the form of the thin film while the printed circuit board forms a low dielectric constant to perform the high speed signal processing.

In addition, it is possible for the method for manufacturing the flexible printed circuit board and the flexible printed circuit board manufactured thereby to slack the heat resistant sheet formed of the polyimide (PI) film of a high heat resistance on the uppermost portion and the lowermost portion thereof, thereby manufacturing the flexible printed circuit board having a high heat resistance together with a low dielectric constant.

That is, it is possible for the method for manufacturing the flexible printed circuit board and the flexible printed circuit board manufactured thereby to form the heat resistant sheet, which is stacked on the uppermost portion and the lowermost portion thereof, with a high heat resistant material such as polyimide or LCP in order to supplement a low heat resistance of a low dielectric constant material, thereby manufacturing the flexible printed circuit board having a high heat resistance together with a low dielectric constant.

Referring to FIGS. 13 to 16, a method for manufacturing a flexible printed circuit board according to a third embodiment of the present disclosure includes preparing a base sheet 310 S310, preparing a bonding sheet 320 S320, stacking the base sheet 310 and the bonding sheet 320 S330, hot pressing S340, forming a through-hole 330 S350, plating a connecting plated layer 340 S360, forming an electrode part S370, and forming an anisotropic conductive layer 350 S380.

The preparing the base sheet 310 S310 prepares a polypropylene (PP) film of a low dielectric constant (hereinafter, referred to as a PP film 312). At this time, the PP film 312 is formed to have a thickness of about 40 μm.

The preparing the base sheet 310 S310 forms a thin film seed layer 314 on the PP film 312. At this time, the thin film seed layer 314 is formed on at least one surface of the upper surface and the lower surface of the PP film 312 through a deposition process or a sputtering process. At this time, the thin film seed layer 314 may be made of a mixed material mixing nickel copper NiCu and copper Cu or a nickel copper NiCu material.

The preparing the base sheet 310 S310 forms an internal plated layer 316 on the thin film seed layer 314. At this time, the preparing the base sheet 310 S310 forms the internal plated layer 316 on the thin film seed layer 314 by electrolytically plating copper Cu.

The preparing the base sheet 310 S310 forms an electrode by removing a part of the thin film seed layer 314 and a part of the internal plated layer 316 through a masking and etching process. At this time, the thin film seed layer 314 and the internal plated layer 316 are used as internal electrodes and circuits of the flexible printed circuit board, and are formed to have a thickness of about 3 μm.

The preparing the bonding sheet 320 S320 prepares the bonding sheet 320 formed of a thin film formed of a polyethylene (PE) film of a low dielectric constant (hereinafter, referred to as a PE film). At this time, the bonding sheet 320 is formed to have a thickness of about 40 μm.

The stacking S330 stacks a plurality of base sheets 310 and the bonding sheet 320. That is, the stacking S330 stacks the plurality of base sheets 310, and stacks the bonding sheet 320 between the base sheet 310 and another base sheet 310.

For example, when manufacturing the flexible printed circuit board by using two base sheets 310, the stacking S330 stacks a first bonding sheet 320 between a first base sheet 310 and a second base sheet 310. The stacking S330 stacks a second bonding sheet 320 on the upper portion of the first base sheet 310, and stacks a third bonding sheet 320 on the lower portion of the second base sheet 310.

The hot pressing S340 bonds (compresses) the plurality of base sheets 310 and the bonding sheet 320 by applying heat and pressure thereto in a state where the plurality of base sheets 310 and the bonding sheet 320 have been stacked thereon. At this time, the hot pressing S340 bonds (compresses) the plurality of base sheets 310 and the bonding sheet 320 by pressurizing while heating it with the heat of the melting temperature or more of the thermoplastic bonding sheet 320.

Herein, the PE film used as the bonding sheet 320 has the melting temperature of about 138° C., and the PP film 312 used as the base sheet 310 has the melting temperature of about 165° C., such that the hot pressing S340 pressurizes while heating it at about 138° C. or more and lower than 165° C.

Therefore, the hot pressing S340 bonds (compresses) the base sheet 310 and the base sheet 310 by melting only the PE film as the bonding sheet 320 while preventing the PP film 312 as the base sheet 310 from melting.

The forming the through hole 330 S350 forms one or more through holes 330 penetrating the laminate bonded through the hot pressing S340. That is, the forming the through hole 330 S350 forms one or more through holes 330 for electrically connecting (i.e., electrically conducting) the electrode (i.e., the thin film seed layer 314 and the internal plated layer 316) formed on the base sheet 310 stacked on the uppermost portion thereof and the electrode formed on the base sheet 310 stacked on the lowermost portion thereof by punching the laminate.

The plating the connecting plated layer 340 S360 plates the through hole 330 and the surfaces of the base sheets 310 of the uppermost portion and the lowermost portion thereof. That is, the plating the connecting plated layer 340 S360 plates the connecting plated layer 340 for electrically connecting (i.e., electrically conducting) the electrode and the electrode through the through hole 330.

Referring to FIG. 17, the plating the connecting plated layer 340 S360 may include plating a first connecting plated layer 420 S360 and plating a second connecting plated layer 440 S360.

The plating the first connecting plated layer 420 S360 forms the first connecting plated layer 420 by plating copper on the inner wall of the through hole 330 and the surface of the base sheet 310 in order to electrically connect (i.e., form electrical-conductivity) the electrode of the base sheet stacked on the uppermost portion thereof and the electrode of the base sheet stacked on the lowermost portion thereof through electroless chemical copper plating.

The plating the second connecting plated layer 440 S360 forms the second connecting plated layer 440 on the surface of the first connecting plated layer 420 through electrolytic copper plating. Therefore, the second connection plating layer 440 reinforces the electrical connection (i.e., electrical-conductivity) of the first connecting plated layer 420.

The forming the electrode part S370 forms an electrode part on the upper surface and the lower surface of the printed circuit board by etching the connecting plated layer 340 and the external plated layer 340. That is, the forming the electrode part S370 forms the electrode part by removing a part of the connecting plated layer 340 and a part of the external plated layer 340 through a masking process and an etching process.

The forming the anisotropic conductive layer 350 S380 forms the anisotropic conductive layer 350 on the laminate on which the electrode part is formed by using an anisotropic conductive material.

For example, when the anisotropic conductive material is an Anisotropic Conductive Paste (ACP), the forming the anisotropic conductive layer 350 S380 forms the anisotropic conductive layer 350 by coating the anisotropic conductive material on the upper surface and the lower surface of the laminate on which the plurality of electrode parts are formed (i.e., the upper surface of the base sheet 310 stacked on the uppermost portion thereof and the lower surface of the base sheet 310 stacked on the lowermost portion thereof). At this time, the forming the anisotropic conductive layer 350 S380 applies an anisotropic conductive material in order to cover all the electrode parts formed on the laminate.

Meanwhile, referring to FIG. 18, when the anisotropic conductive material is an Anisotropic Conductive Film (ACF), the forming the anisotropic conductive layer 350 S380 forms the anisotropic conductive layer 350 by bonding the anisotropic conductive material on the upper surface and the lower surface of the laminate on which the plurality of electrode parts are formed (i.e., the upper surface of the base sheet 310 stacked on the uppermost portion thereof and the lower surface of the base sheet 310 stacked on the lowermost portion thereof). At this time, the forming the anisotropic conductive layer 350 S380 bonds the anisotropic conductive material in order to cover all electrode parts formed on the laminate.

At this time, the anisotropic conductive film is a thermosetting film including a conductive ball therein, and when heat and pressure are applied to a material in the form of a double-sided tape in which an adhesive agent cured by heat and fine conductive balls therein are mixed, the conductive ball is broken to electrically connect the element mounted on the printed circuit board and the electrode part.

Therefore, the flexible printed circuit board may electrically connect the elements mounted on the upper portion of the flexible printed circuit board only to the electrode part, and prevent the electrode part and another electrode part from being electrically connected.

In addition, it is possible for the flexible printed circuit board to form the anisotropic conductive layer on the electrode part, thereby increasing the durability of the electrode part, and preventing the occurrence of short on the connecting portion where the electrode part and the element are connected. That is, the anisotropic conductive film electrically conducts the element and the electrode part on in the thickness direction of the film, respectively, as heat and pressure are applied thereto in the process of bonding the element to the electrode part. As a result, it is possible to protect the connecting portion of the element and the electrode part, to increase durability, and to prevent the occurrence of short on the connecting portion.

Referring to FIG. 19, the flexible printed circuit board manufactured by the method for manufacturing the flexible printed circuit board according to the third embodiment of the present disclosure stacks the plurality of base sheets 310, and bonds the plurality of base sheets 310 with the bonding sheet 320 interposed between the base sheet 310 and another base sheet 310. The anisotropic conductive layer 350 is formed on the upper surface of the base sheet 310 stacked on the uppermost portion thereof and the lower surface of the base sheet 310 stacked on the lowermost portion thereof.

The base sheet 310 is formed of the PP film 312 having the melting temperature higher than that of the bonding sheet 320 and having a low dielectric constant. The base sheet 310 has an electrode formed by removing a part of the thin film seed layer 314 and a part of the internal plated layer 316 formed on at least one surface of the upper surface and the lower surface thereof. At this time, since the flexible printed circuit board is used as a circuit using a high frequency, the base sheet 310 is preferably formed of the PP film 312 having a low dielectric constant.

The bonding sheet 320 is a material for bonding the base sheets 310 when the flexible printed circuit board is manufactured, and bonds the base sheets 310 through a heating and pressurizing process. The bonding sheet 320 is melted by the high temperature applied during the heating and pressurizing process to bond the base sheets 310.

At this time, since the flexible printed circuit board is used as a circuit using a high frequency, the bonding sheet 320 has a low dielectric constant and is preferably formed of the PE film having the melting temperature relatively lower than the melting temperature of the PP film 312 used as the base sheet 310.

The anisotropic conductive layer 350 is formed to cover all of the electrode parts formed on the base sheet 310. The anisotropic conductive film may be a thermosetting film including a conductive ball, and may be an Anisotropic Conductive Paste (ACP) or an Anisotropic Conductive Film (ACF).

The anisotropic conductive film is a thermosetting film including a conductive ball therein, and when heat and pressure are applied to a material in the form of a double-sided tape in which an adhesive agent cured by heat and fine conductive balls therein are mixed, the conductive ball is broken to electrically connect the element mounted on the printed circuit board and the electrode part.

As described above, it is possible for the method for manufacturing the flexible printed circuit board and the flexible printed circuit board manufactured thereby to stack the base sheet formed of the polypropylene (PP) film of a low dielectric constant and the bonding sheet formed of the polyethylene (PE) film of a low dielectric constant thereon, thereby minimizing a dielectric loss due to the high frequency signal and preventing a loss of the high frequency signal.

In addition, it is possible for the method for manufacturing the flexible printed circuit board and the flexible printed circuit board manufactured thereby to constitute a circuit by using the thin films such as the polypropylene film and the polyethylene film, thereby minimizing the thickness thereof while performing a high speed signal processing.

In addition, it is possible for the method for manufacturing the flexible printed circuit board and the flexible printed circuit board manufactured thereby to constitute the base sheet formed of the polypropylene (PP) film of a low dielectric constant, thereby minimizing a dielectric loss and performing a high speed signal processing of a high frequency signal by forming a dielectric constant lower than that of the conventional flexible printed circuit board constituting the base sheet formed of the polyimide film.

In addition, it is possible for the method for manufacturing the flexible printed circuit board and the flexible printed circuit board manufactured thereby to constitute the bonding sheet formed of the polyethylene film of a low dielectric constant, thereby manufacturing it in the form of the thin film while the printed circuit board forms a low dielectric constant to perform the high speed signal processing.

In addition, it is possible for the method for manufacturing the flexible printed circuit board and the flexible printed circuit board manufactured thereby to stack the anisotropic conductive layer on the electrode part, thereby electrically connecting the elements mounted on the upper portion of the flexible printed circuit board only to the electrode part, and preventing the electrode part and another electrode part from being electrically connected.

In addition, it is possible for the method for manufacturing the flexible printed circuit board and the flexible printed circuit board manufactured thereby to form the anisotropic conductive layer on the electrode part, thereby preventing the occurrence of short on the connecting portion where the electrode part and the element are connected. That is, the anisotropic conductive film electrically conducts the element and the electrode part on in the thickness direction of the film, respectively, as heat and pressure are applied thereto in the process of bonding the element to the electrode part. As a result, it is possible to protect the connecting portion of the element and the electrode part, to increase durability, and to prevent the occurrence of short on the connecting portion.

Referring to FIGS. 20 to 22, a method for manufacturing a flexible printed circuit board according to a fourth embodiment of the present disclosure includes preparing a base sheet 410 S410, laminating a plurality of bonding sheets 410 S420, preparing a flame retardant sheet 420 S430, aligning the flame retardant sheet 420 with the laminate on which the plurality of base sheets 410 have been laminated S440, laminating the flame retardant sheet 420 and the laminate S450, forming a through-hole 430 S460, plating a connecting plated layer 440 S470, and forming a circuit pattern S480.

The preparing the base sheet 410 S410 prepares a polypropylene (PP) film of a low dielectric constant (hereinafter, referred to as a PP film 412). At this time, the PP film 412 is formed to have a thickness of about 40 μm.

The preparing the base sheet 410 S410 forms an internal thin film seed layer 414 on the PP film 312. The internal thin film seed layer 414 is formed thereon through a deposition process or a sputtering process. The internal thin film seed layer 414 is formed on at least one surface of the upper surface and the lower surface of the PP film 412. The internal thin film seed layer 414 may be made of a mixed material mixing nickel copper NiCu and copper Cu or a nickel copper NiCu material.

The preparing the base sheet 410 S410 forms an internal plated layer 416 on the internal thin film seed layer 414. At this time, the preparing the base sheet 410 S410 forms the internal plated layer 416 on the internal thin film seed layer 414 by electrolytically plating copper Cu.

The preparing the base sheet 410 S410 forms an internal electrode by removing a part of the internal thin film seed layer 414 and a part of the internal plated layer 416 through a masking and etching process. At this time, the internal thin film seed layer 414 and the internal plated layer 416 are used as internal electrodes and circuits of the flexible printed circuit board, and are formed to have a thickness of about 3 μm.

The laminating the plurality of base sheets 410 S420 stacks the plurality of base sheets 410. At this time, the laminating the plurality of base sheets 410 S420 stacks about six base sheets 410, for example.

The laminating the plurality of base sheets 410 S420 constitutes a laminate by laminating the plurality of base sheets 410 through a heating and pressurizing process in a state where the plurality of base sheets 410 have been stacked. At this time, since the base sheet 410 is formed of the PP film 412 having the melting temperature of about 165° C., the laminating the plurality of base sheets 410 S420 laminates the plurality of base sheets 410 by heating it at about 165° C. or more.

The preparing the flame retardant sheet 420 S430 prepares a FR4 film 422 of flame retardancy and low dielectric constant. The FR4 film 422 is made of a material having high mechanical strength and flame retardancy, and low dielectric constant. The FR4 film 422 is made of a composite material in which a woven fiberglass cloth and an epoxy resin binder are mixed. The FR4 film 422 is formed to have a thickness of about 40 μm.

The preparing the flame retardant sheet 420 S430 forms an external thin film seed layer 424 on the FR4 film 422. The external thin film seed layer 424 is formed thereon through a deposition process or a sputtering process. The external thin film seed layer 424 is formed on one surface of the upper surface and the lower surface of the FR4 film 422.

The preparing the flame retardant sheet 420 S430 forms an external plated layer 426 on the external thin film seed layer 424. At this time, the preparing the flame retardant sheet 420 S430 forms the external plated layer 426 on the external thin film seed layer 424 by electrolytically plating copper Cu.

The preparing the flame retardant sheet 420 S430 forms an external electrode by removing a part of the external thin film seed layer 424 and a part of the external plated layer 426 through a masking and etching process. At this time, the external thin film seed layer 424 and the external plated layer 426 are used as external electrodes and circuits of the printed circuit board, and are formed to have a thickness of about 3 μm.

The aligning the flame retardant sheet 420 with the laminate S440 aligns the flame retardant sheet 420 with the upper surface and the lower surface of the laminate where the plurality of base sheets 410 have been laminated. That is, the aligning the flame retardant sheet 420 with the laminate S440 adjusts the internal electrode formed on the laminate on which the plurality of base sheets 410 have been laminated and the external electrode formed on the flame retardant sheet 420 to be disposed on the same vertical line thereof.

The laminating the flame retardant sheet 420 and the laminate S450 laminates the laminate and the flame retardant sheet 420 through a heating and pressurizing process in a state where the laminate on which the plurality of base sheets 410 are laminated and the flame retardant sheet 420 have been aligned. At this time, since the base sheet 410 is formed of the PP film 412 having the melting temperature of about 165° C., and the flame retardant sheet 420 is formed of the FR4 film having the melting temperature of about 412° C., the laminating the flame retardant sheet 420 and the laminate S450 laminates the flame retardant sheet 420 and the laminate by heating it at the temperature of about 412° C. or more and lower than 165° C.

The forming the through hole 430 S460 forms one or more through holes 430 on the laminate on which the flame retardant sheet 420 has been laminated. The forming the through hole 430 S460 forms one or more through holes 430 on the laminate through a punching process. The one or more through holes 430 are formed by penetrating the laminate on which the flame retardant sheet 420 has been laminated. The through hole 430 may electrically connect (i.e., electrically conduct) the internal electrode and the external electrode.

The plating the connecting plated layer 440 S470 plates the through hole 430 and the surfaces of the flame retardant sheet 420 of the uppermost portion and the lowermost portion thereof. The connecting plated layer 440 is plated on the inner wall surface of the through hole 430 and the surface of the flame retardant sheet 420 stacked on the uppermost portion and the lowermost portion of the laminate. The connecting plated layer 440 may electrically connect (i.e., electrically conduct) the internal electrode and the external electrode through the through hole 430.

Referring to FIG. 23, the plating the connecting plated layer 440 S470 may include plating a first connecting plated layer 442 S720 and plating a second connecting plated layer 444 S740.

The plating the first connecting plated layer 442 S720 forms the first connecting plated layer 442 through electroless chemical copper plating. The first connecting plated layer 442 is plated on the inner wall surface of the through hole 430 and the surface of the flame retardant sheet 420.

The first connecting plated layer 442 may electrically connect (i.e., form the electrical-conductivity) the internal electrode and the external electrode. The internal electrode includes the internal thin film seed layer 414 and the internal plated layer 416 of the base sheet 410. The external electrode includes the external thin film seed layer 424 and the external plated layer 426 of the flame retardant sheet 420.

The plating the second connecting plated layer 440 S740 forms the second connecting plated layer 444 on the surface of the first connecting plated layer 442 through electrolytic copper plating. The second connecting plated layer 444 reinforces the electrical connection (i.e., the electrical-conductivity) of the first connecting plated layer 442.

The forming the circuit pattern S480 forms a circuit pattern on the upper surface and the lower surface of the laminate by etching the connecting plated layer 440. The forming the circuit pattern S480 forms the circuit pattern by removing a part of the connecting plated layer 440 through a masking process and an etching process.

Meanwhile, the method for manufacturing the flexible printed circuit board may further include forming a protective layer on the upper portion and the lower portion of the flexible printed circuit board on which the circuit patterns (i.e., the connecting plated layer 440 and the external plated layer 426) are formed.

The forming the protective layer forms a protective layer for covering and protecting the surfaces of the circuit and the flame retardant sheet 420 by curing after applying a liquid-state coating fluid on the surfaces of the circuit pattern and the heat resistant member.

At this time, it is preferable that the protective layer is formed of a synthetic resin coating layer by using the same series of coating fluid as that of the flame retardant sheet 420, thereby having an excellent adhesive force with the flame retardant sheet 420 and being more firmly integrated with the flame retardant sheet 420. Since the flame retardant sheet 420 is formed of the FR4 film 422, the protective layer may be a FR4 coating layer; for example.

In addition, the method for manufacturing the flexible printed circuit board may further include forming a terminal part. At this time, the forming the terminal part may form a terminal part by plating a conductive material such as copper on the corresponding region after removing a part of the protective layer.

Referring to FIG. 24, the flexible printed circuit board manufactured by the method for manufacturing the flexible printed circuit board according to the fourth embodiment of the present disclosure is configured by stacking the flame retardant sheet 420 on the upper surface and the lower surface of the base sheet 410. At this time, the flexible printed circuit board is configured by bonding the base sheet 410 and other bonding sheets by melting the PP film 412, and bonding the laminate on which the base sheets 410 are laminated and the flame retardant sheet 420.

The base sheet 410 is formed of the PP film 412 having a low dielectric constant. The base sheet 410 has an internal electrode by removing a part of the internal thin film seed layer 414 and a part of the internal plated layer 416 formed on any one surface of the upper surface and the lower surface thereof. At this time, since the flexible printed circuit board is used as a circuit using a high frequency, the base sheet 410 is preferably formed of the PP film 412 having a low dielectric constant.

The flame retardant sheet 420 is formed of the FR4 film 422 having flame retardancy and a low dielectric constant together with an excellent mechanical strength (hardness). At this time, since the printed circuit board is used as the circuit using a high frequency, the flame retardant sheet 420 is preferable formed on the FR4 film 422 having a high mechanical strength and a low dielectric constant.

As described above, it is possible for the method for manufacturing the flexible printed circuit board and the flexible printed circuit board manufactured thereby to stack the flame retardant sheet having flame retardancy and a low dielectric constant on the upper surface and the lower surface of the laminate laminated by stacking the plurality of base sheets having a low dielectric constant, respectively, thereby minimizing a dielectric loss due to the high frequency signal and preventing a loss of the high frequency signal.

In addition, it is possible for the method for manufacturing the flexible printed circuit board and the flexible printed circuit board manufactured thereby to constitute a circuit by using the thin films such as the polypropylene film and the FR4 film, thereby minimizing the thickness thereof while performing a high speed signal processing.

In addition, it is possible for the method for manufacturing the flexible printed circuit board and the flexible printed circuit board manufactured thereby to constitute the base sheet formed of the polypropylene (PP) film of a low dielectric constant, thereby minimizing a dielectric loss and performing a high speed signal processing of a high frequency signal by forming a dielectric constant lower than that of the conventional, flexible printed circuit board constituting the base sheet formed of the polyimide film.

In addition, the method for manufacturing the flexible printed circuit board and the flexible printed circuit board manufactured thereby may manufacture the flexible printed circuit board having flame retardancy together with a low dielectric constant forming the flame retardant sheet on the uppermost portion and the lowermost portion thereof.

In addition, it is possible for the method for manufacturing the flexible printed circuit board and the flexible printed circuit board manufactured thereby to stack the hard flame retardant sheet on the upper surface and the lower surface of the flexible laminate of the base sheet, thereby securing the mechanical strength (i.e., hardness) of the printed circuit board.

As described above, although preferred embodiments according to the present disclosure have been described, it is to be understood by those skilled in the art that they may be modified into various forms, and various modifications and changes thereof may be embodied by those skilled in the art without departing from the scope of the present disclosure.

The invention claimed is:

1. A flexible printed circuit board, comprising:
    a laminate on which a base sheet and a bonding sheet are laminated;
    an electrode formed on at least one surface of the upper surface and the lower surface of the laminate;
    a heat resistant sheet stacked on at least one surface of the upper surface and the lower surface of the laminate; and
    a heat blocking sheet stacked between the laminate and the heat resistant sheet,
    wherein a melting temperature of the bonding sheet is lower than a melting temperature of the base sheet, wherein a melting temperature of the heat resistant sheet is equal to or higher than the melting temperature of the bonding sheet, and wherein a melting temperature of the heat blocking sheet is equal to or higher than the melting temperature of the heat resistant sheet.

2. The flexible printed circuit board of claim 1,
wherein the base sheet is a polypropylene film on which an internal terminal is formed on at least one surface of the upper surface and the lower surface thereof, and
wherein the bonding sheet is one selected from a polyethylene film and a polypropylene film.

3. The flexible printed circuit board of claim 1,
wherein the heat resistant sheet is one selected from a polyimide film and a liquid crystal polymer film, and an external plated layer is formed on one surface of the upper surface and the lower surface thereof.

4. The flexible printed circuit board of claim 1, further comprising an anisotropic conductive layer formed on at least one surface of the upper surface and the lower surface of the laminate.

5. The flexible printed circuit board of claim 4,
wherein the anisotropic conductive layer is an anisotropic conductive paste or an anisotropic conductive film.

6. The flexible printed circuit board of claim 4
wherein the anisotropic conductive layer is formed to cover all of the plurality of electrode parts formed on the upper surface and the lower surface of the laminate.

7. A method for manufacturing a flexible printed circuit board, comprising:
preparing a base sheet;
preparing a bonding sheet having a melting temperature lower than a melting temperature of the base sheet;
preparing a heat resistant sheet having a melting temperature equal to or higher than the melting temperature of the bonding sheet;
preparing a heat blocking sheet having a melting temperature equal to or higher than the melting temperature of the heat resistant sheet;
forming a laminate by stacking the base sheet and the bonding sheet; and
bonding by heating and pressurizing the laminate,
wherein the forming the laminate comprises
forming the laminate by alternately stacking the base sheet and the bonding sheet;
stacking the heat blocking sheet on the upper surface and the lower surface of the laminate; and
stacking the heat resistant sheet on the upper surface of the heat blocking sheet stacked on the upper surface of the laminate, and on the lower surface of the heat blocking sheet stacked on the lower surface of the laminate.

8. The method for manufacturing the flexible printed circuit board of claim 1,
wherein the base sheet is a polypropylene film having an internal terminal formed on at least one surface of the upper surface and the lower surface thereof, and
wherein the bonding sheet is one of a polyethylene film and a polypropylene film.

9. The method for manufacturing the flexible printed circuit board of claim 1,
wherein the preparing the heat resistant sheet prepares the heat resistant sheet having an external plated layer formed on one surface of the upper surface and the lower surface thereof, and
wherein the heat resistant sheet is one of a polyimide film and a liquid crystal polymer film.

10. The method for manufacturing the flexible printed circuit board of claim 1, further comprising forming an anisotropic conductive layer on the upper surface and the lower surface of the laminate bonded in the bonding.

11. The method for manufacturing the flexible printed circuit board of claim 10,
wherein the forming the anisotropic conductive layer forms the anisotropic conductive layer to cover all of one or more electrodes formed on at least one surface of the upper surface and the lower surface of the laminate.

12. The method for manufacturing the flexible printed circuit board of claim 10,
wherein the forming the anisotropic conductive layer forms the anisotropic conductive layer by applying an anisotropic conductive paste on the upper surface and the lower surface of the laminate.

13. The method for manufacturing the flexible printed circuit board of claim 10,
wherein the forming the anisotropic conductive layer forms the anisotropic conductive layer by bonding an anisotropic conductive film on the upper surface and the lower surface of the laminate.

14. The method for manufacturing the flexible printed circuit board of claim 1,
wherein the bonding heats the laminate at the temperature equal to or higher than the melting temperature of the bonding sheet and lower than the melting temperature of the base sheet.

15. The method for manufacturing the flexible printed circuit board of claim 1, further comprising
forming one or more through holes penetrating the laminate bonded in the bonding;
forming a connecting plated layer on the surface of the through hole and the upper surface and the lower surface of the laminate; and
forming a circuit pattern on at least one surface of the laminate by etching the connecting plated layer and an external plated layer.

16. The method for manufacturing the flexible printed circuit board of claim 15,
wherein the forming the connecting plated layer comprises
forming a first connecting plated layer on the surface of the through hole and the upper surface and the lower surface of the laminate through electroless plating; and
forming a second connecting plated layer on the surface of the first connecting plated layer through electrolytic plating.

* * * * *